(12) United States Patent
Glasgow et al.

(10) Patent No.: US 11,942,741 B2
(45) Date of Patent: Mar. 26, 2024

(54) METER SOCKET WITH METER JAW AND TERMINATION CONNECTOR ASSEMBLY

(71) Applicant: MILBANK MANUFACTURING CO., Kansas City, MO (US)

(72) Inventors: Shawn Glasgow, Kansas City, MO (US); William McCarthy, Kansas City, MO (US)

(73) Assignee: MILBANK MANUFACTURING CO., Kansas City, MO (US)

(*) Notice: Subject to any disclaimer, the term of this patent is extended or adjusted under 35 U.S.C. 154(b) by 212 days.

(21) Appl. No.: 17/737,228

(22) Filed: May 5, 2022

(65) Prior Publication Data

US 2023/0361492 A1 Nov. 9, 2023

(51) Int. Cl.
*H01R 4/36* (2006.01)
*H01R 13/03* (2006.01)
*H01R 13/11* (2006.01)
*H01R 33/06* (2006.01)

(52) U.S. Cl.
CPC ............... *H01R 4/36* (2013.01); *H01R 13/03* (2013.01); *H01R 13/113* (2013.01); *H01R 33/06* (2013.01)

(58) Field of Classification Search
CPC ........ H01R 4/36; H01R 13/03; H01R 13/113; H01R 33/06
See application file for complete search history.

(56) References Cited

U.S. PATENT DOCUMENTS

| | | | |
|---|---|---|---|
| 7,503,800 B2 | 3/2009 | Siglock et al. | |
| 7,785,137 B2 | 8/2010 | Porter et al. | |
| 7,850,483 B2 | 12/2010 | Siglock et al. | |
| 8,033,875 B1 * | 10/2011 | Maguire | H01R 4/38 439/762 |
| 8,202,134 B2 * | 6/2012 | Moon | H01M 50/103 439/878 |
| 9,595,846 B2 * | 3/2017 | Siglock | H02J 9/061 |
| 10,381,183 B2 * | 8/2019 | Sweeney | H01R 4/36 |
| 10,510,226 B2 * | 12/2019 | Siglock | G08B 13/06 |
| 10,886,638 B1 | 1/2021 | McCarthy et al. | |
| 2021/0203141 A1 | 7/2021 | Hagen et al. | |
| 2022/0034940 A1 | 2/2022 | Hrenchir et al. | |
| 2022/0065281 A1 | 3/2022 | Hagen | |
| 2022/0115849 A1 | 4/2022 | Hagen et al. | |
| 2022/0178977 A1 * | 6/2022 | Linnell | G01R 22/066 |

* cited by examiner

*Primary Examiner* — Phuong Chi Thi Nguyen
(74) *Attorney, Agent, or Firm* — STINSON LLP

(57) ABSTRACT

A meter socket with a meter jaw and termination connector assembly is disclosed. The termination connector is configured to receive a conductor and includes a connector tab with an opening formed therein. The meter jaw is configured to receive a connector blade of an electric meter and includes a boss projecting therefrom. The boss of the meter jaw is positioned within the opening and secured to the connector tab of the termination connector so as mechanically, electrically and thermally connect the meter jaw to the termination connector.

30 Claims, 31 Drawing Sheets

METER SOCKET WITH METER JAW AND TERMINATION CONNECTOR ASSEMBLY

BACKGROUND OF THE INVENTION

A conventional meter box comprises an electric watt-hour meter installed within a meter socket. In a single-phase power system, the meter socket includes two line-side electrical connectors that connect the power supply conductors to the meter and, similarly, two load-side electrical connectors that connect the power load conductors to the meter. In a three-phase power system, the meter socket includes three line-side electrical connectors that connect the power supply conductors to the meter and, similarly, three load-side electrical connectors that connect the power load conductors to the meter. In both types of systems, electrical current flows from the electric power utility over the power supply conductors to the line-side electrical connectors of the meter socket, through the meter, to the load-side electrical connectors of the meter socket and over the power load conductors to the customer premise.

FIG. 1 shows an electrical connector 10 that is commonly used in the line-side electrical connectors and load-side electrical connectors of a conventional meter socket. Electrical connector 10 includes a termination connector having a U-shaped connector body 12 that is configured to receive an end of a stripped conductor, e.g., a stranded wire. A slide nut 14 engages a pair of receiving grooves 16a and 16b in connector body 12, and a slide screw 18 extends through an opening in slide nut 14 via a threaded connection and applies direct pressure to the stranded wire placed in connector body 12 in order to force the stranded wire into good mechanical, electrical and thermal contact with the lower bight section 20 of connector body 12. The bight section 20 includes grooves that protrude slightly inward from its inner surface so as to grip the stranded wire. Electrical connector 10 also includes a meter jaw 22 that is configured to receive a connector blade of the electric meter. Connector body 12 is mechanically, electrically and thermally coupled to meter jaw 22 by a bolt 24 and jaw nut 26. Bolt 24 extends through a hole in the mounting block (from the back side to the front side) and through holes in connector body 12, meter jaw 22 and jaw nut 26, and a securing nut 28 is then placed over the front end of bolt 24 to secure connector 10 to the mounting block.

Other examples of electrical connectors are disclosed in U.S. Pat. Nos. 7,503,800, 8,702,455, 9,397,413, and 10,886,638.

BRIEF SUMMARY OF THE INVENTION

The present invention is directed to a meter jaw and termination connector assembly that may be used as an electrical connector of a meter socket. In general terms, the assembly comprises (a) a termination connector that includes a connector tab with an opening formed therein and (b) a meter jaw that includes a boss positioned within the opening and secured to the connector tab so as to mechanically, electrically and thermally connect the meter jaw to the termination connector.

In one aspect, a meter socket is provided that includes a plurality of meter jaw block assemblies mounted within a meter socket enclosure. Each meter jaw block assembly includes a line-side electrical connector and a load-side electrical connector, both of which are supported by an insulating mounting block. Each of the electrical connectors includes (a) a termination connector configured to receive a conductor, wherein the termination connector includes a connector tab with an opening formed therein and (b) a meter jaw configured to receive a connector blade of an electric meter, wherein the meter jaw includes a boss positioned within the opening and secured to the connector tab so as mechanically, electrically and thermally connect the meter jaw to the termination connector.

In another aspect, a method of making an electrical connector is provided. The method includes the steps of providing a termination connector that includes a connector tab with an opening formed therein; providing a meter jaw that includes a boss projecting therefrom; positioning the boss of the meter jaw within the opening formed in the connector tab; and forcing a punch into the boss of the meter jaw to secure the boss of the meter jaw to the connector tab of the termination connector.

The meter jaw and termination connector assembly of the present invention provides several advantages over conventional electrical connectors. For example, additional fasteners (such as a bolt and/or jaw nut) are not required to secure the meter jaw to the termination connector, which reduces material and labor costs for manufacture of the assembly. Also, the use of a punch to secure the boss of the meter jaw to the connector tab of the termination connector provides a connection with good electrical conductivity and thermal conductivity, which results in a lower temperature rise and higher performance of the assembly. Of course, other advantages of the present invention will be apparent to those skilled in the art.

BRIEF DESCRIPTION OF THE DRAWINGS

Various exemplary embodiments of the present invention are described in detail below with reference to the attached drawing figures, wherein.

DETAILED DESCRIPTION OF EXEMPLARY EMBODIMENTS

Figure 1:
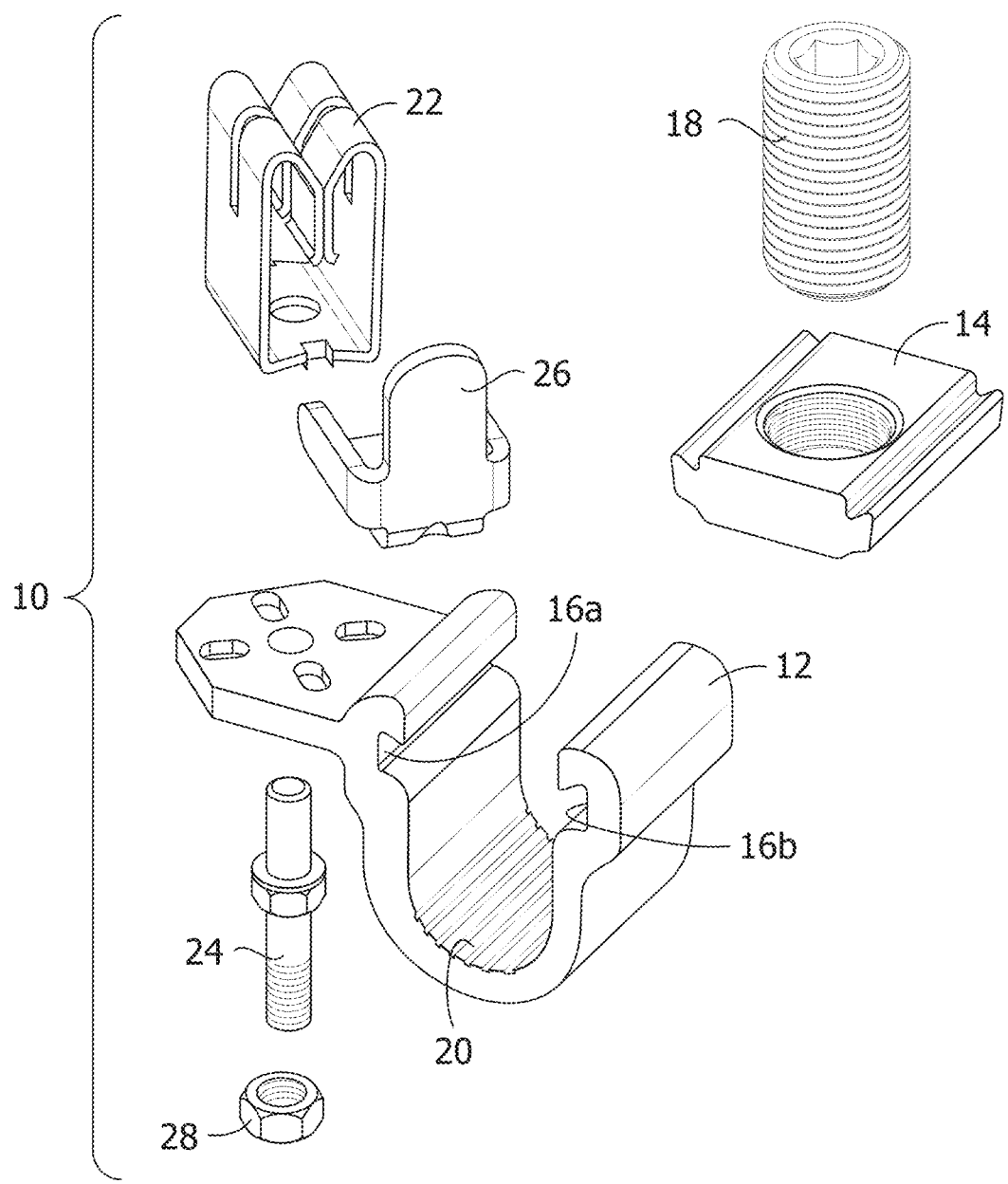
FIG. 1 is an exploded perspective view of a prior art electrical connector for a meter socket.
Figure 2:
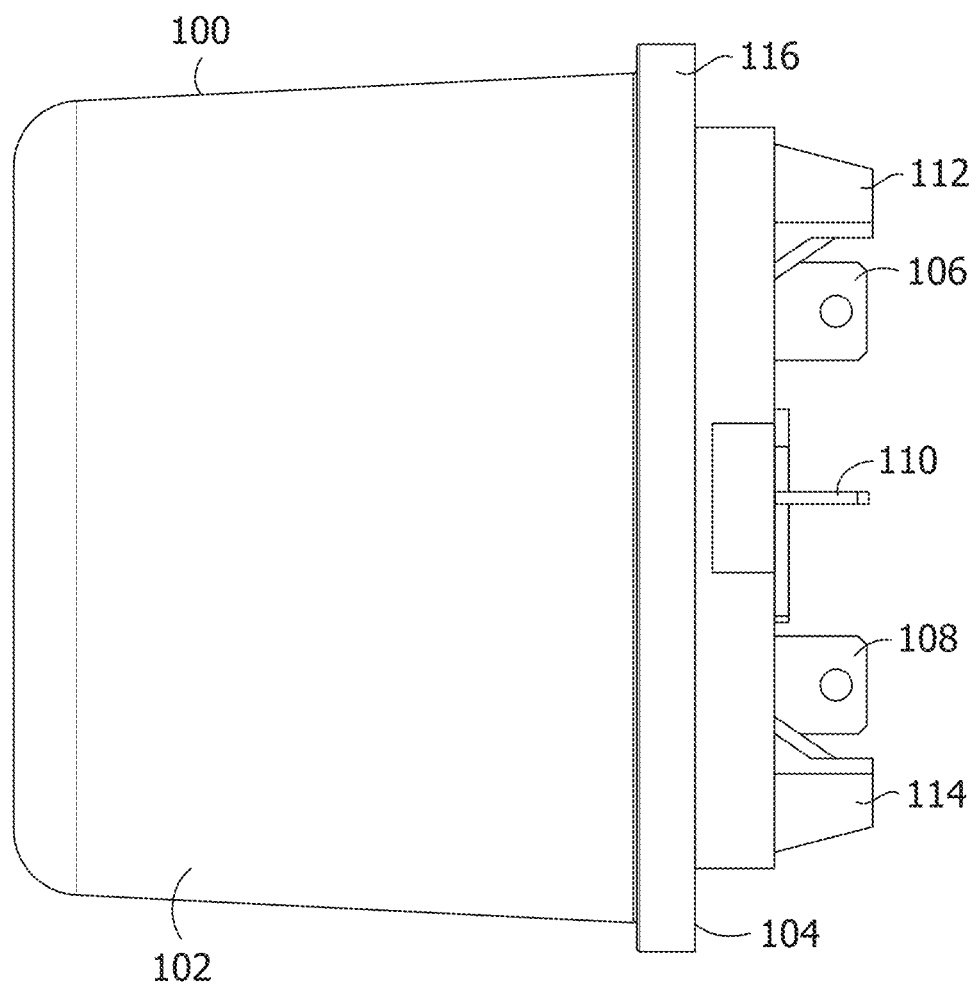
FIG. 2 is a right side elevational view of an electric watt-hour meter.

The present invention is directed to a meter jaw and termination connector assembly that may be used as an electrical connector of a meter socket. While the present invention will be described in detail below with reference to various exemplary embodiments, it should be understood that the invention is not limited to the specific configurations of these embodiments. In addition, although the exemplary embodiments are described as embodying several different inventive features, one skilled in the art will appreciate that any one of these features could be implemented without the others in accordance with the present invention.

I. Exemplary Embodiments

FIGS. 2-6 show a single-phase power system comprising an electric watt-hour meter 100 installed within a meter socket 200 in accordance with an exemplary embodiment of the present invention. Meter socket 200 is a "ringless" meter socket and has a standardized form to allow the interchangeability of meters from various manufacturers without removing any wires or cables. While meter socket 200 may be employed for meters capable of continuous full load currents of 20 to 400 amperes, it is most typically utilized for residential applications of 200 amperes. Of course, other types of meter sockets may also be used, such as a "ring-type" meter socket.

In this exemplary embodiment, meter 100 is an AMI (advanced metering infrastructure) meter that communicates with the electric power utility over an existing communication network, although other types of meters may also be used. The configuration of meter 100 is shown in greater detail in FIG. 2. As can be seen, meter 100 includes a cylindrical cover 102 that is made of glass, transparent plastic (e.g., polycarbonate), or any other suitable material. Cover 102 is secured to a meter base 104 so as to enclose various electronic components within the meter. These electronic components are well known to those skilled in the art. Preferably, a seal (not shown) is used to provide a tight connection between cover 102 and meter base 104 and thereby protect the electronic components from environmental elements. An annular flange 116 extends radially outward from base 104 and includes a front rim 116a (shown in FIG. 4) that provides a mounting connection to a meter socket.

Meter 100 also includes two upper connector blades 106 (only one of which can be seen in FIG. 2) and two lower connector blades 108 (only one of which can be seen in FIG. 2) that extend outward from the back side of meter base 104. As described below, connector blades 106 and 108 are positioned to snap into the upper and lower meter jaws, respectively, of meter jaw block assemblies (such as of the meter jaw block assemblies 250 and 252 shown in FIG. 5, described below). A blade 110 also extends outward from the back side of meter base 104 and is positioned to engage an electrical connector used as a neutral reference for certain types of service. Two upper legs 112 (only one of which can be seen in FIG. 2) and two lower legs 114 (only one of which can be seen in FIG. 2) are also provided that protect blades 106, 108 and 110 when meter 100 is not installed.

Figure 3:
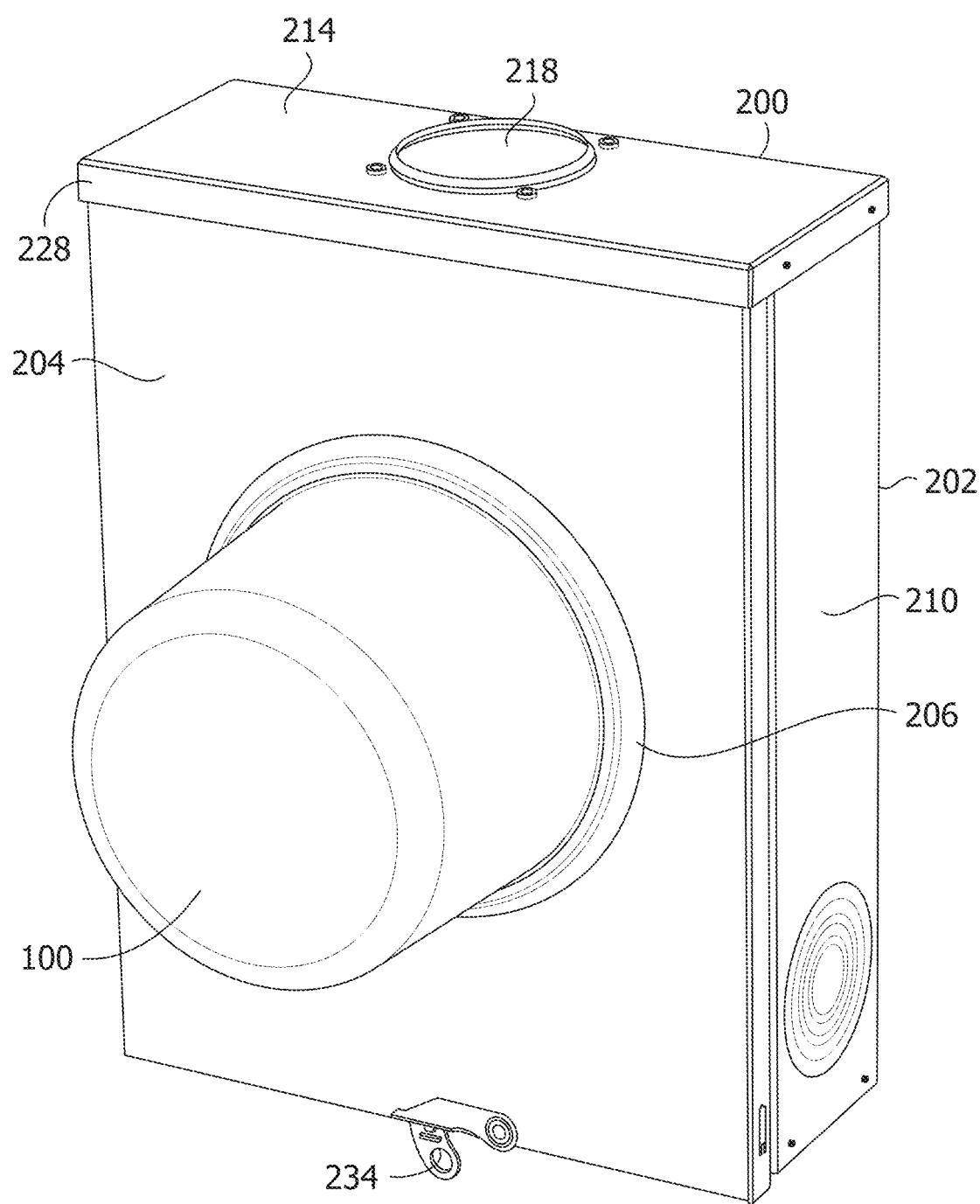
FIG. 3 is a perspective view of the electric watt-hour meter shown in FIG. 2 installed within a ringless meter socket of a single-phase power system in accordance with an exemplary embodiment of the present invention.
Figure 4:
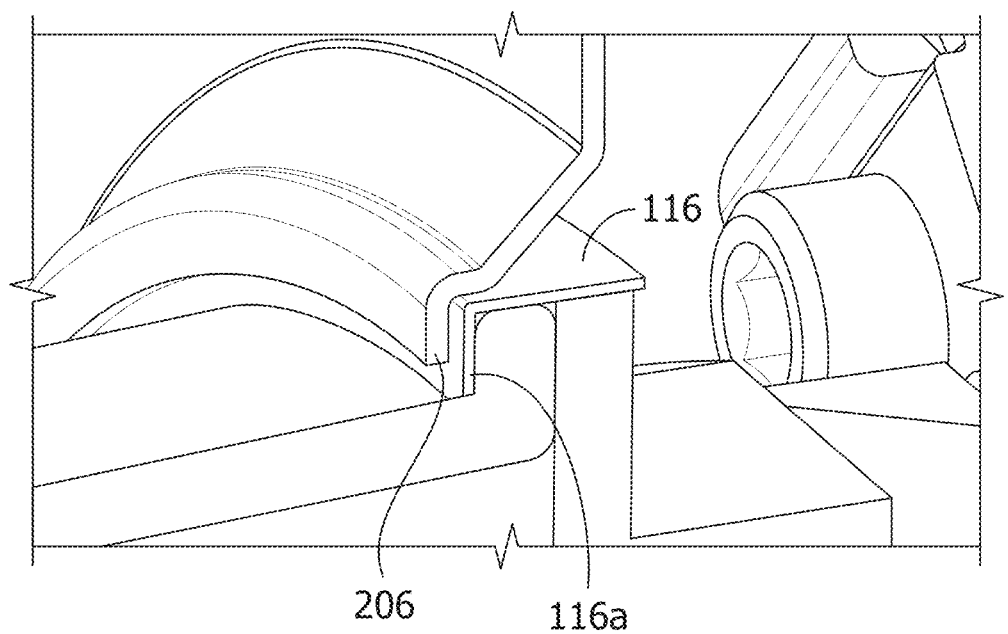
FIG. 4 is an enlarged cross-sectional view of the meter socket and installed meter shown in FIG. 3 showing the cover of the meter socket enclosure retaining the meter in the meter socket.

Referring to FIG. 3, meter socket 200 includes an enclosure 202 having a front wall or cover 204 with a raised embossment 206 surrounding a circular opening through which meter 100 extends. As shown in FIG. 4, raised embossment 206 engages front rim 116a of annular flange 116 on meter 100 (also shown in FIG. 2) when cover 204 is latched to thereby retain meter 100 against the meter supports 268 and 270 (shown in FIG. 5) of meter socket 200, as described below. Thus, it can be appreciated that meter 100 can only be removed from meter socket 200 if cover 204 is removed from meter socket enclosure 202.

Figure 5:
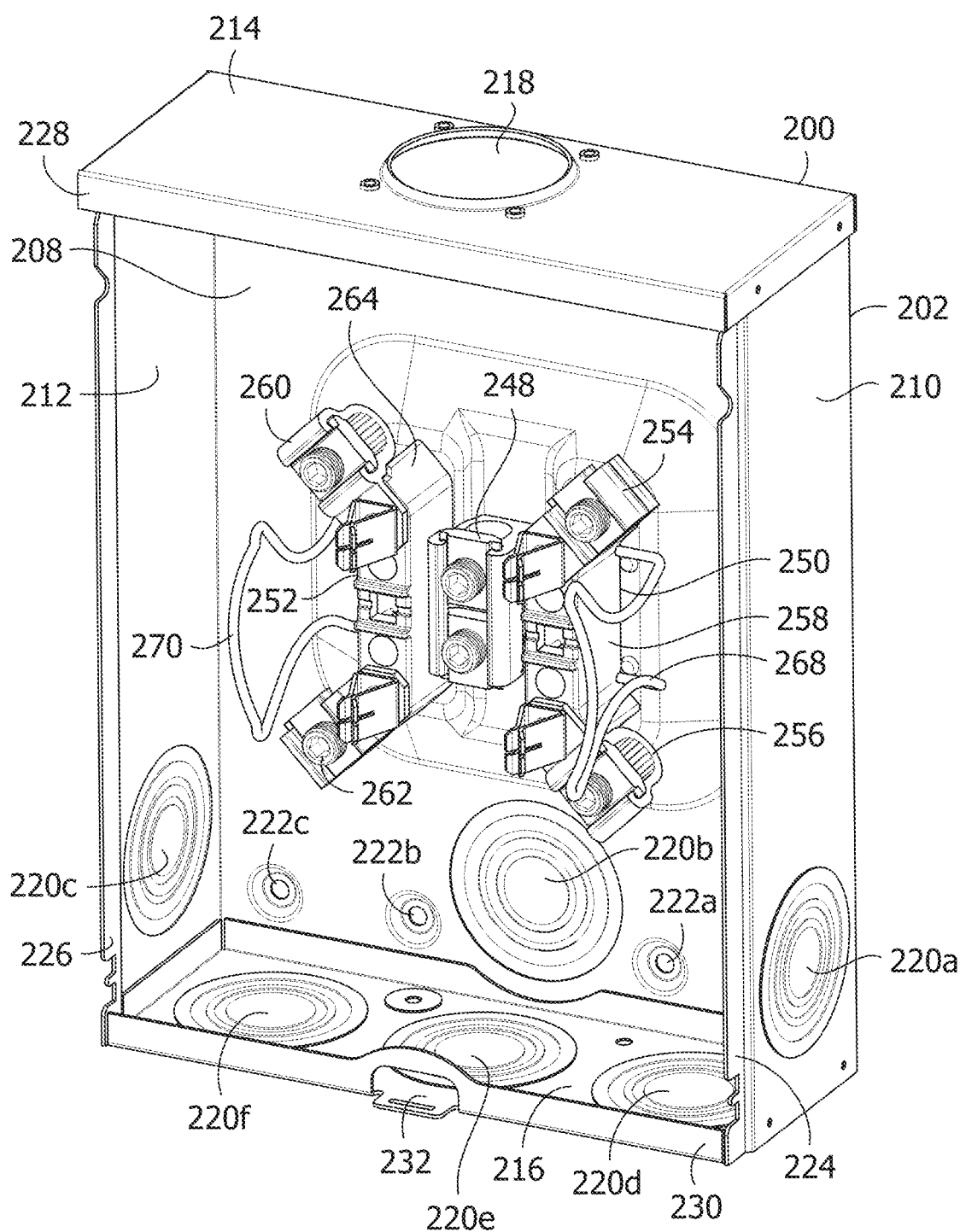
FIG. 5 is a perspective view of the meter socket shown in FIG. 3 with the meter removed from the meter socket.
Figure 6:
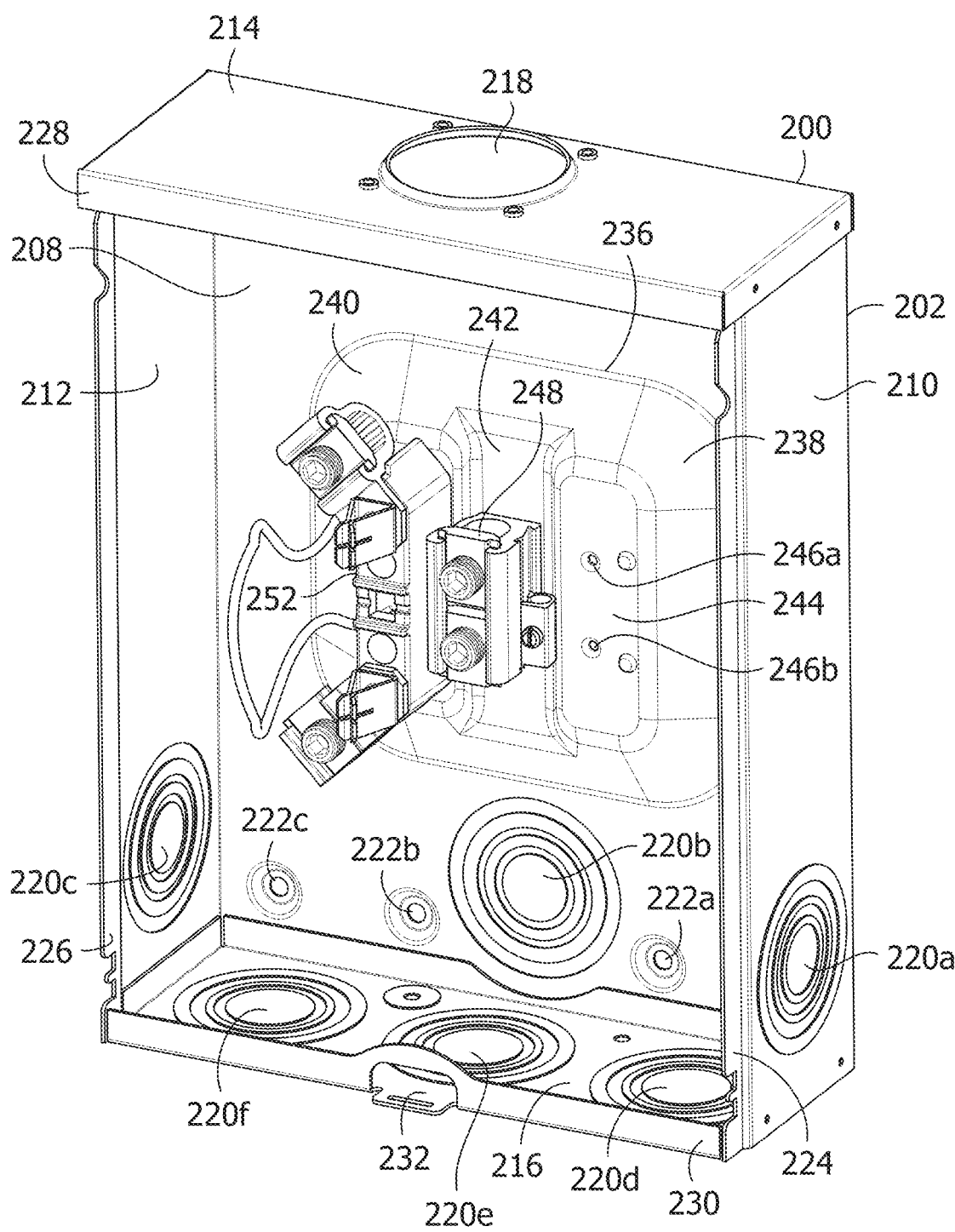
FIG. 6 is a perspective view of the meter socket shown in FIG. 5 with the right meter jaw block assembly removed from the meter socket.
Figure 7:
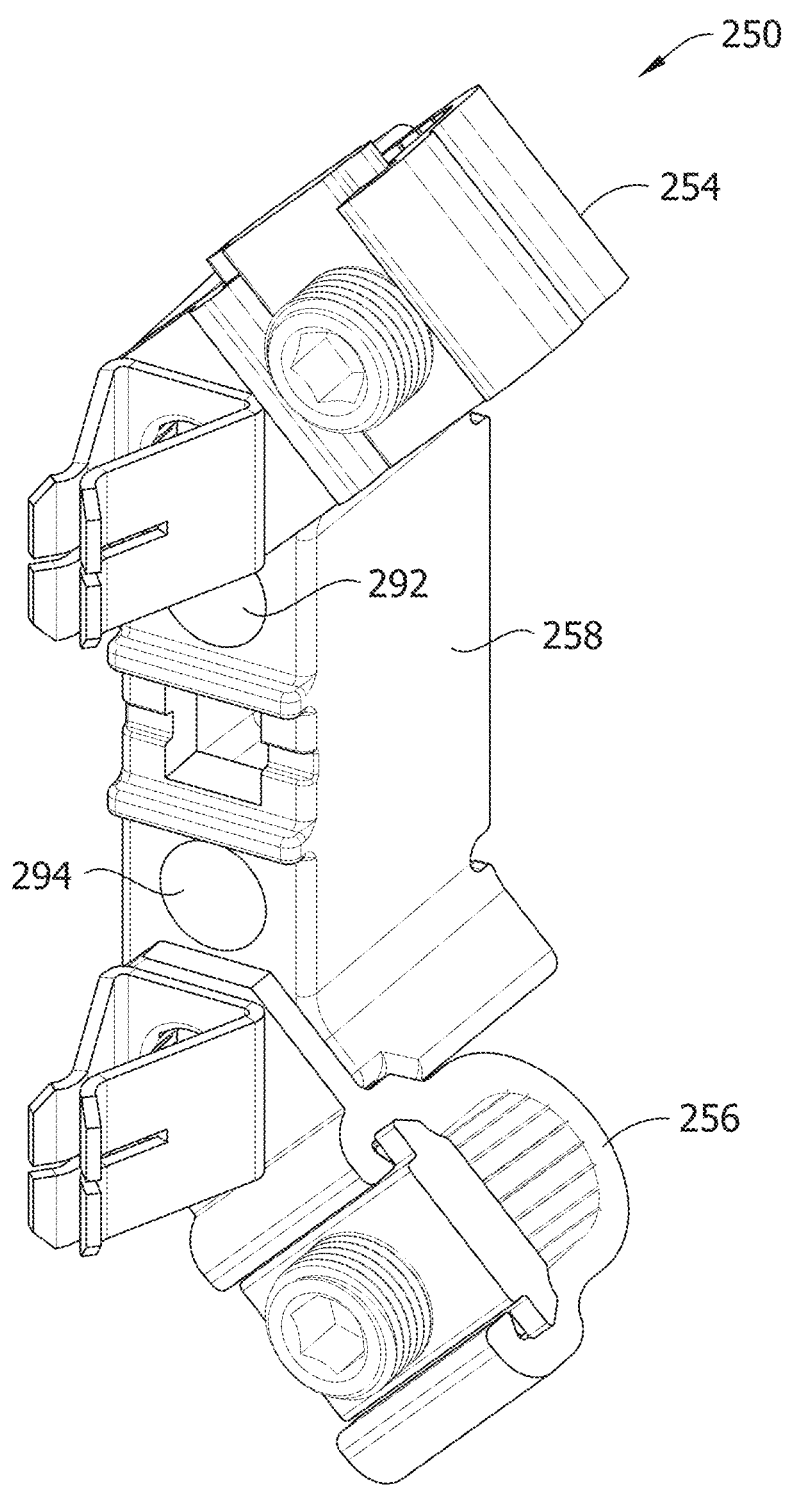
FIG. 7 is a perspective view of the right meter jaw block assembly of the meter socket shown in FIG. 5 with the meter support removed from the assembly.

As shown in FIGS. 5 and 6, meter socket enclosure 202 also includes a back wall 208, a pair of laterally spaced side walls 210 and 212, a top wall 214, and a bottom wall 216. Side walls 210 and 212 are integral with back wall 208 and are formed by bending side portions of an enclosure blank. Top and bottom walls 214 and 216 are formed as separate members and are secured to back wall 208 and side walls 210 and 212 by any suitable attachment means, such as by spot welding, fasteners, or the like. Of course, top and bottom walls 214 and 216 could alternatively be formed integral with back wall 208.

Top wall 214 is provided with an opening 218 to receive the power supply conductors (not shown) from the electric power utility. Bottom wall 216 and lower portions of side walls 210 and 212 and back wall 208 are provided with knock-outs 220a-220f, which may be selectively opened to enable the power load conductors (not shown) to exit enclosure 202 for routing to a customer premises. Back wall 208 is provided with preformed holes 222a-222c that receive fasteners to secure enclosure 202 to a supporting wall.

To accommodate cover 204, side walls 210 and 212 include inset edges 224 and 226, respectively, while top and bottom walls 214 and 216 include top and bottom flanges 228 and 230, respectively. The upper edge of cover 204 fits under top flange 228 and the inturned side edges of cover 204 overlap inset edges 224 and 226. Bottom flange 230 underlies the bottom edge of cover 204. Bottom flange 230 is provided with a slotted tab 232 that engages a latch 234 rotationally fixed by a rivet to cover 204 (shown in FIG. 3). Electric power utility personnel use a custom tool to secure latch 234 on tab 232 and prevent unauthorized removal of cover 204 (and thus meter 100) from meter socket 200.

As best shown in FIG. 6, meter socket enclosure 202 includes a riser structure 236 that is formed by embossing or stamping back wall 208 between a set of appropriately shaped dies during manufacture of enclosure 202. Riser structure 236 has a pair of laterally spaced risers 238 and 240 separated by a recessed wall 242. Each of risers 238 and 240 includes a planar front wall 244 (only the front wall of riser 238 can be seen in FIG. 6) spaced forward of back wall 208. The spacing of each front wall 244 from back wall 208 is chosen to properly position two meter jaw block assemblies 250 and 252 (shown in FIG. 5) in relation to back wall 208. Each front wall 244 is also provided with holes 246a and 246b (only the holes of front wall 244 can be seen in FIG. 6) to receive respective mounting screws to thereby secure meter jaw block assemblies 250 and 252 to front walls 244 of risers 238 and 240. Recessed wall 242 forms a separation between risers 238 and 240 and includes holes (not shown) to receive a ground conductor connector 248. Recessed wall 242 is positioned in a recessed plane located between the plane of back wall 208 and the plane of front walls 244 of risers 238 and 240.

One skilled in the art will appreciate that other types of riser structures may also be used in accordance with the present invention. For example, a riser structure could be configured with a single riser (instead of risers 238 and 240 and recessed wall 242) of sufficient width for proper spacing of meter jaw block assemblies 250 and 252. Also, a separate riser structure could be provided that is secured to back wall 208. Further, a riser structure could be used that mounts three or more meter jaw block assemblies, such as for use with a three-phase system.

Referring to FIG. 5, meter socket 200 includes a first meter jaw block assembly 250 secured to the front wall of riser 238 and a second meter jaw block assembly 252 secured to the front wall of riser 240. Meter jaw block assembly 250 includes a top electrical connector 254 and a bottom electrical connector 256 each of which is mounted to an insulating mounting block 258. Similarly, meter jaw block assembly 252 includes a top electrical connector 260 and a bottom electrical connector 262 each of which is mounted to an insulating mounting block 264. It can be appreciated that electric utility power is provided at top electrical connectors 254 and 260 and customer power is provided at bottom electrical connectors 256 and 262. Mounting blocks 258 and 264 function to insulate top electrical connectors 254 and 260 and bottom electrical connectors 256 and 262 from enclosure 202. Optionally, a fifth electrical connector may be mounted within an opening in the center of mounting block 264 and used as a neutral reference for certain types of service. Meter jaw block assemblies 250 and 252 also include meter supports 268 and 270 that provide a mounting surface and transient suppression ground terminal for meter 100.

Referring to FIGS. 7-10, the configuration of meter jaw block assembly 250 (with meter support 268 removed) will now be described in greater detail. One skilled in the art will appreciate that the configuration of meter jaw block assembly 252 mirrors that of meter jaw block assembly 250 and will not be separately described herein.

Figure 8:
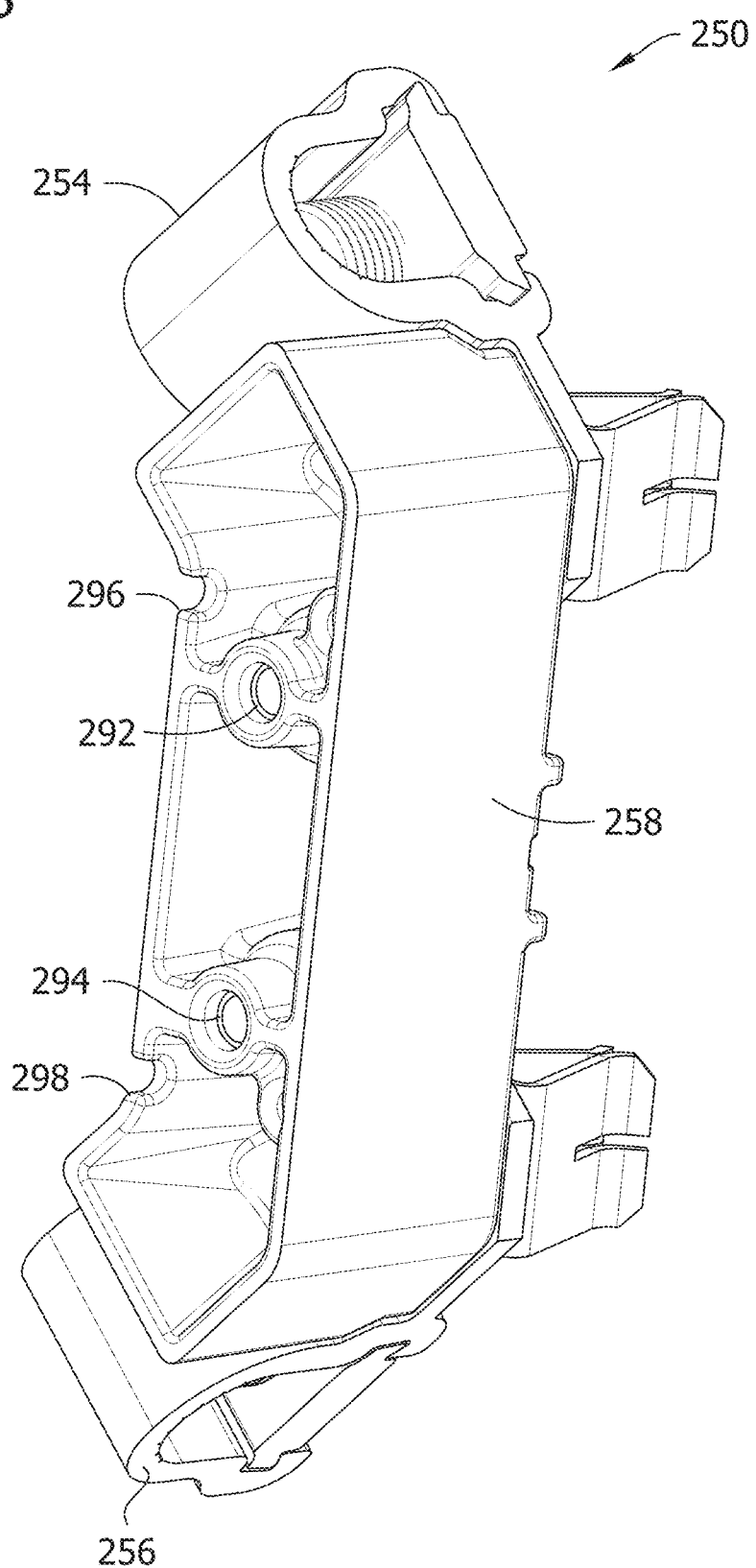
FIG. 8 is a perspective view of the left side of the meter jaw block assembly shown in FIG. 7.
Figure 9:
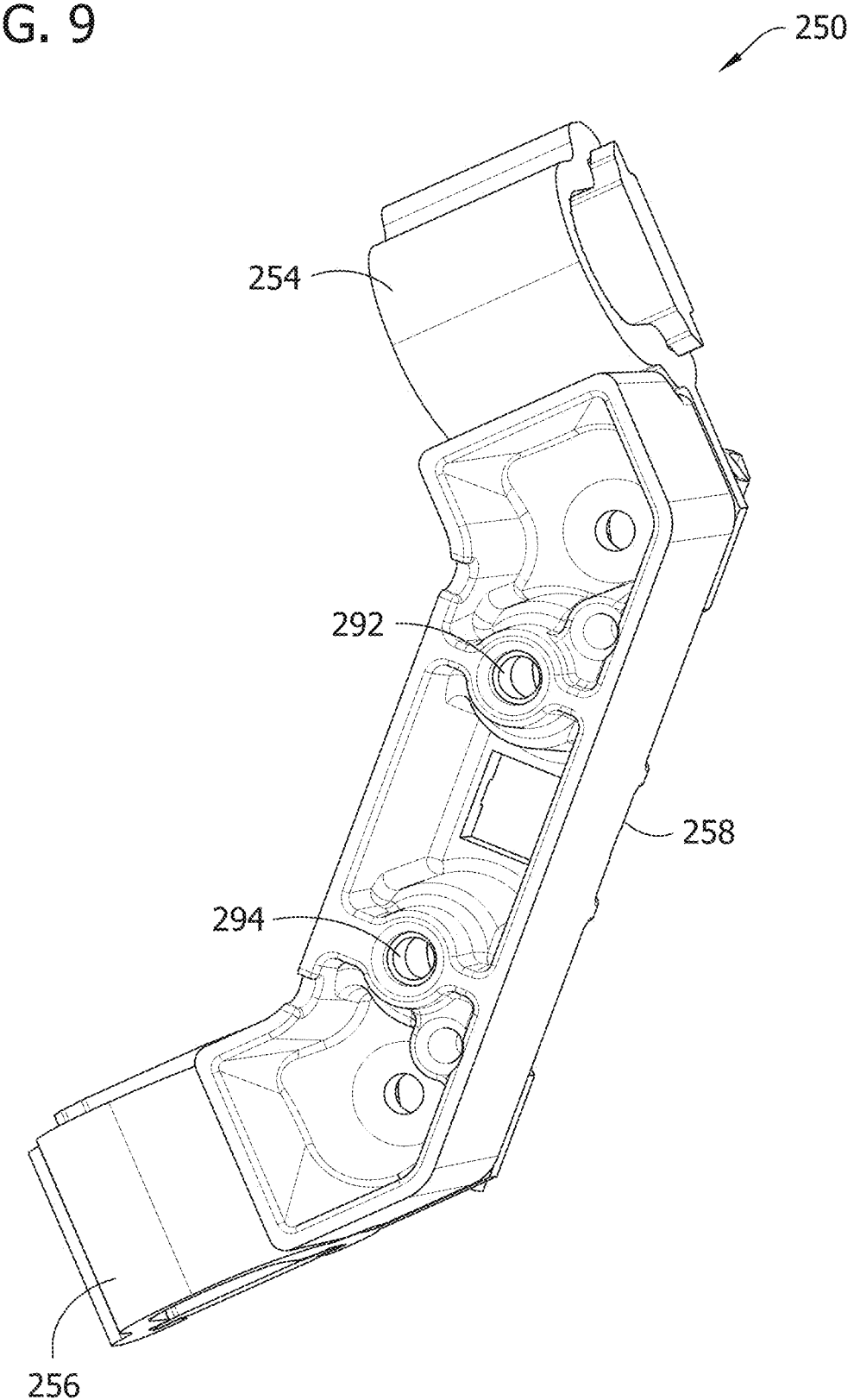
FIG. 9 is a perspective view of the back side of the meter jaw block assembly shown in FIG. 7.

As just described, meter jaw block assembly 250 includes an insulating mounting block 258 with top electrical connector 254 and bottom electrical connector 256 secured thereto. Meter jaw block assembly 250 includes mounting screws (not shown) that extend through mounting holes 292 and 294 formed in mounting block 258. After passing through mounting block 258, the mounting screws are received within holes 246a and 246b provided in front wall 244 of riser 238 (shown in FIG. 6) to secure meter jaw block assembly 250 to enclosure 202. Also, as shown in FIG. 8, mounting block 258 includes two slots 296 and 298 located on its right/back side that are positioned to retain meter support 268 (shown in FIG. 5) in the appropriate position for mounting meter 100.

Figure 10:
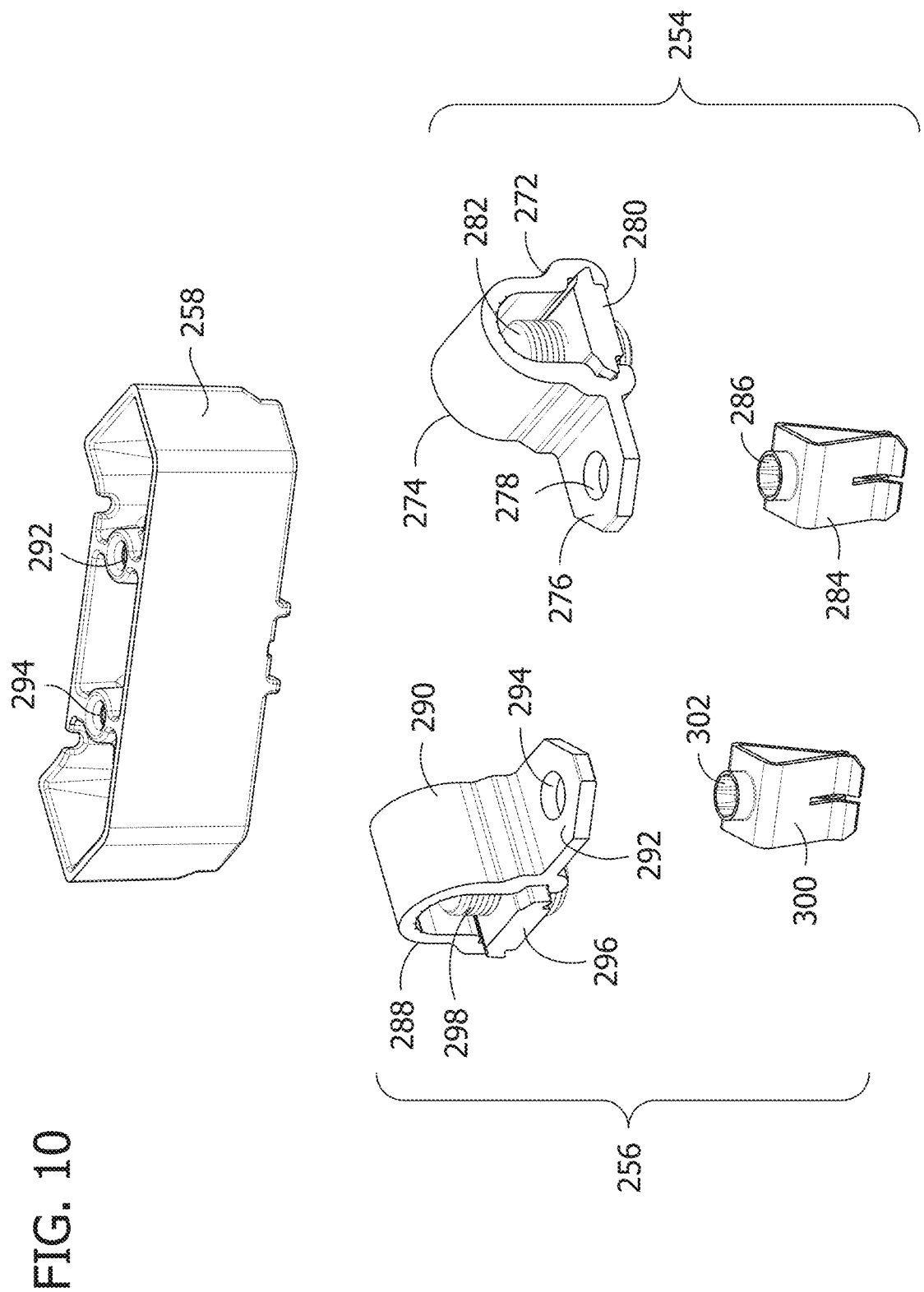
FIG. 10 is a partially exploded perspective view of the components of the meter jaw block assembly shown in FIG. 7.

As best shown in FIG. 10, top electrical connector 254 includes a termination connector 272 comprising a U-shaped connector body 274 having a connector tab 276 with an opening 278 formed therein, as well as a slide nut 280 and threaded slide screw 282. Electrical connector 254 also includes a meter jaw 284 with a boss 286 projecting therefrom. It will be seen that boss 286 is positioned within the opening 278 and secured to connector tab 276 so as to mechanically, electrically and thermally connect meter jaw 284 to termination connector 272.

Similarly, bottom electrical connector 256 includes a termination connector 288 comprising a U-shaped connector body 290 having a connector tab 292 with an opening 294 formed therein, as well as a slide nut 296 and threaded slide screw 298. Electrical connector also includes a meter jaw 300 with a boss 302 projecting therefrom. It will be seen that boss 302 is positioned within the opening 294 and secured to connector tab 292 so as to mechanically, electrically and thermally connect meter jaw 300 to termination connector 288.

Top electrical connector 254 and bottom electrical connector 256 may each be attached to mounting block 258 using any type of attachment mechanism known in the art, such as a fastener (e.g., bolt, screw, etc.) or an interlocking snap fit mechanism that does not require the use of fasteners.

Figure 11:
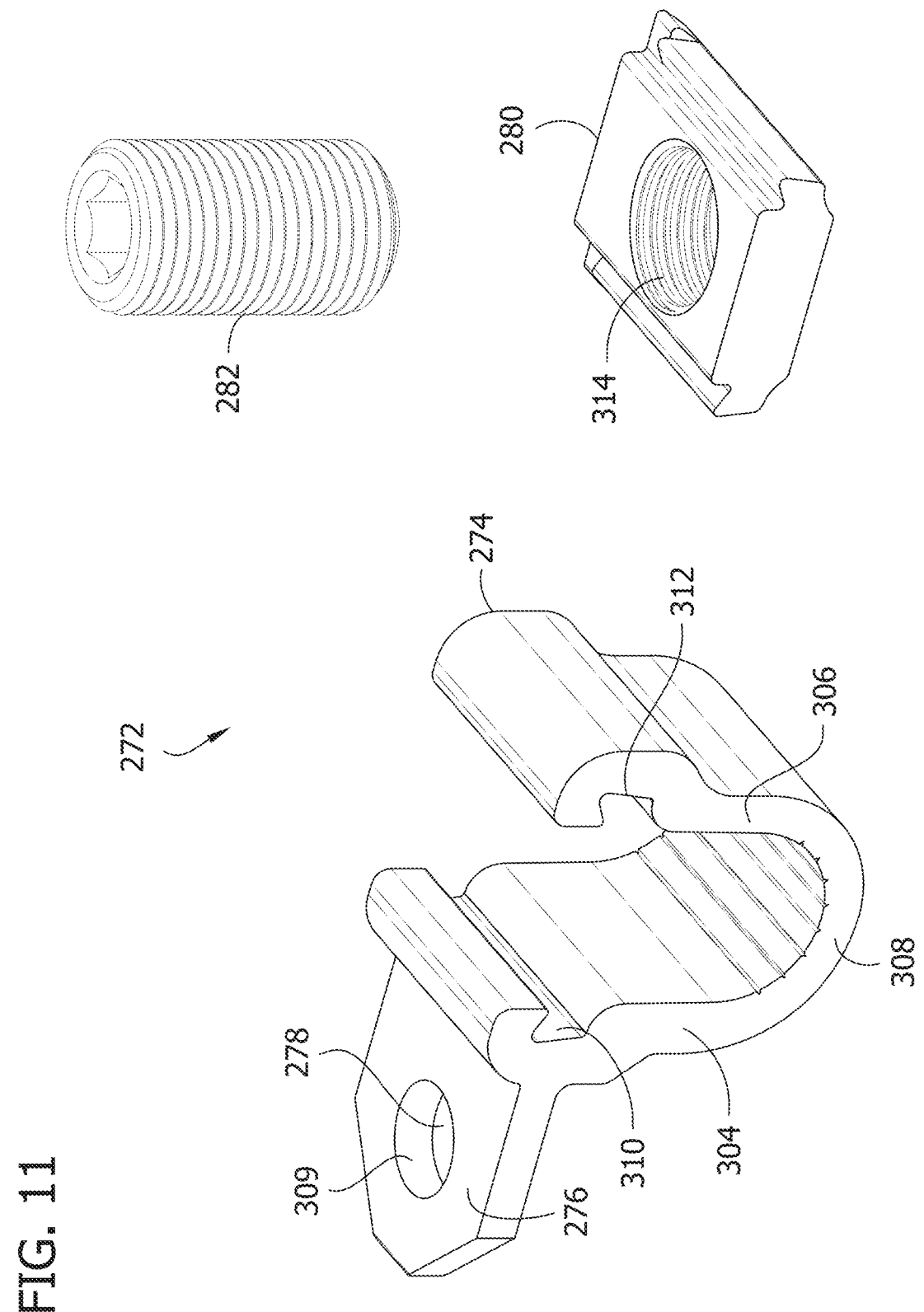
FIG. 11 is an exploded perspective view of the termination connector shown in FIG. 10.

Referring to FIG. 11, the configuration of termination connector 272 (i.e., connector body 274, slide nut 276, and threaded slide screw 278) of top electrical connector 254 will now be described in greater detail. One skilled in the art will appreciate that termination connector 288 of bottom electrical connector 256 has the same configuration as that of top electrical connector 254 and will not be separately described herein.

Connector body 274 includes two spaced apart, generally parallel legs 304 and 306 connected by a curved bight section 308 that define a channel for receiving an end portion of one of the power supply conductors. The bight section 308 includes grooves that protrude slightly inward from its inner surface so as to grip the conductor. In this embodiment, connector tab 276 extends outward from the top outer surface of leg 304. Of course, other types of termination connectors may have a connector tab located in a different position with respect to connector body 274. As can be seen, connector tab 276 has an inner wall 309 that defines the opening 278 formed therein.

Legs 304 and 306 of connector body 274 include slide nut grooves 310 and 312 formed in their inner surfaces in spaced relation to bight section 308 so as to slideably receive slide nut 280. Slide nut 280 has a threaded aperture 314 formed therethrough to receive threaded slide screw 282, which is illustrated as an Allen type screw. When slide screw 282 is torqued to a specified torque value, slide screw 282 (which may incorporate a ball, cone or flat point) applies direct pressure to the power supply conductor placed within connector body 274 in order to force the power supply conductor toward bight section 308.

One skilled in the art will appreciate that the present invention is not limited to the structural configuration of termination connector 272. Various alternative embodiments showing termination connectors with other structural configurations are described below in connection with FIGS. 12 and 13.

Figure 12:
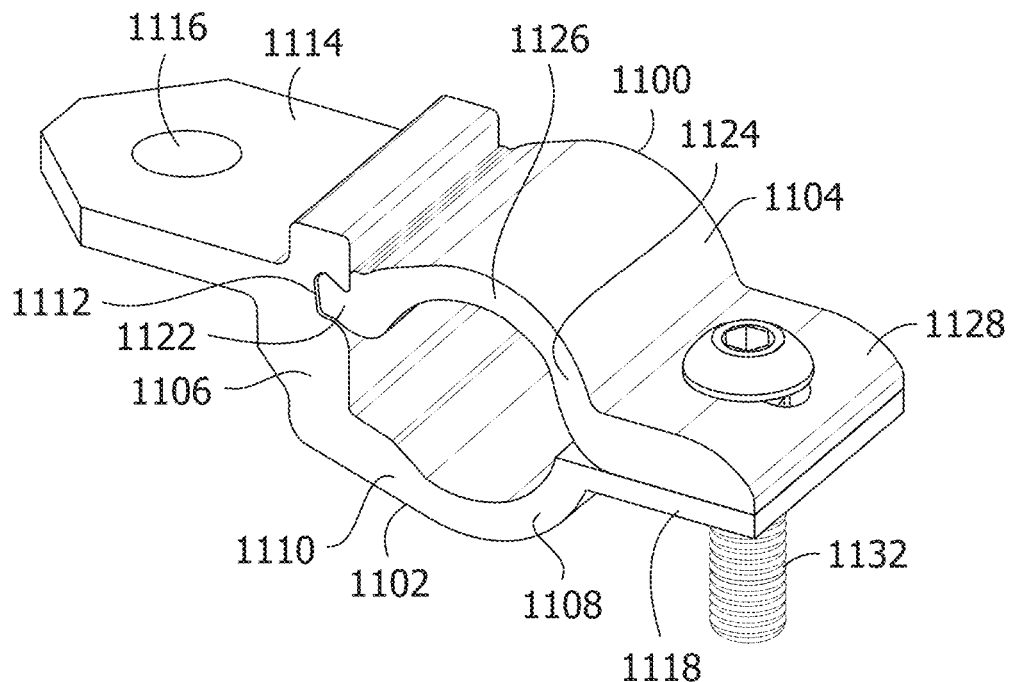
FIG. 12 is a perspective view of an alternative pivoting-style termination connector.

FIG. 12 shows an alternative embodiment of a pivoting style termination connector 1100 that may be used in place of the termination connectors of the exemplary embodiment described above. Termination connector 1100 includes a C-shaped lower connector body 1102 and a C-shaped upper connector body 1104 that define a channel for receiving an end portion of one of the power supply conductors or power load conductors.

Lower connector body 1102 has two spaced apart end sections 1106 and 1108 connected by a curved lower bight section 1110. A pivot body groove 1112 is formed in the inner surface of end section 1106. Extending from the outer surface of end section 1106 is a connector tab 1114 with an opening 1116 formed therein to enable attachment of termination connector 1100 to meter jaw 284. End section 1108 has an extension 1118 with a threaded opening formed therein, as discussed below.

Upper connector body 1104 has two spaced apart end sections 1122 and 1124 connected by a curved upper bight section 1126. End section 1122 is received in pivot body groove 1112 of lower connector body 1102. Alternatively, the pivot action may be accomplished by utilizing a metal pin that is secured by either upper connector body 1104 or lower connector body 1102. End section 1124 has an extension 1128 with an opening formed therein, as discussed below.

A pivot screw 1132 projects through the opening of extension 1128 of upper connector body 1104 and is received in the threaded opening of extension 1118 of lower connector body 1102. Pivot screw 1132 is configured to cause upper connector body 1104 to pivot with respect to lower connector body 1102 and clamp the power supply conductor or power load conductor within termination connector 1100.

Figure 13:
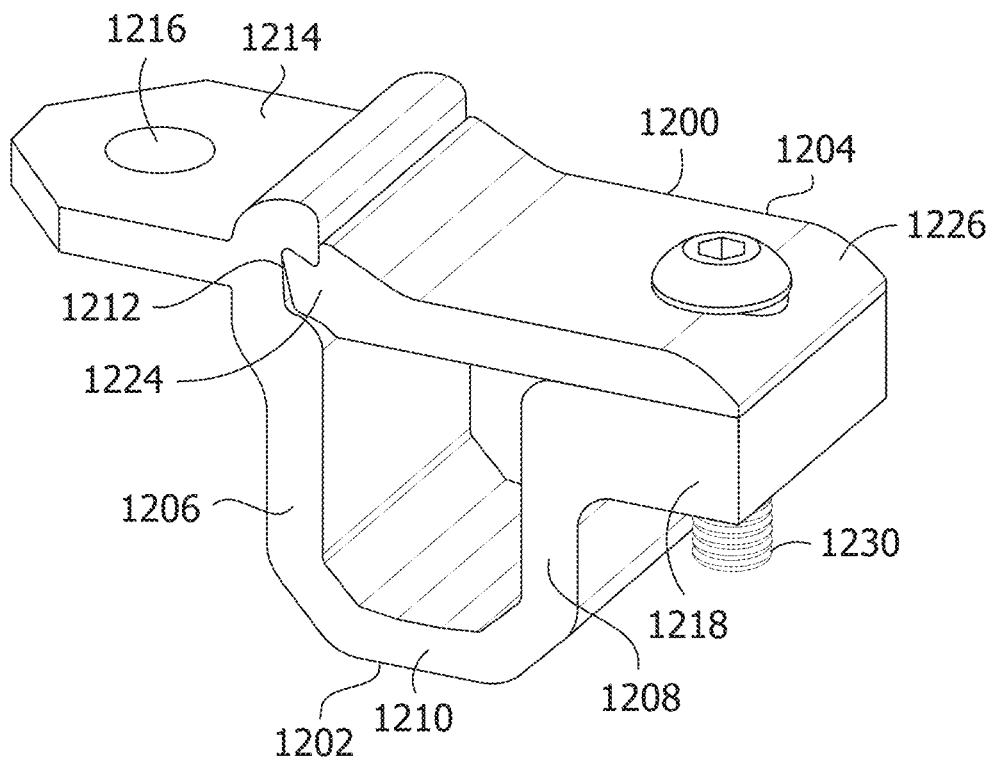
FIG. 13 is a perspective view of another alternative pivoting-style termination connector.

FIG. 13 shows another alternative embodiment of a pivoting style termination connector 1200 that may be used in place of the termination connectors of the exemplary embodiment described above. Termination connector 1200 includes a U-shaped connector body 1202 and a pivot body 1204 that define a channel for receiving an end portion of one of the power supply conductors or power load conductors.

Connector body 1202 includes two spaced apart legs 1206 and 1208 connected by a bight section 1210. A pivot body groove 1212 is formed in the inner surface of leg 1206. Extending from the outer surface of leg 1206 is a connector tab 1214 with an opening 1216 formed therein to enable attachment of termination connector 1200 to meter jaw 284. Leg 1208 has an extension 1218 with a threaded opening formed therein, as discussed below.

Pivot body 1204 has a first end section 1224 received in the pivot body groove 1212 of connector body 1202. A second end section 1226 of pivot body 1204 has an opening formed therein, as discussed below.

A pivot screw 1230 projects through the opening of second end section 1226 of pivot body 1204 and is received in the threaded opening of extension 1218 of connector body 1202. Pivot screw 1230 is configured to cause pivot body 1204 to pivot with respect to connector body 1202 and clamp the power supply conductor or power load conductor within termination connector 1200.

In each of the termination connectors 272, 1100 and 1200 described above, the connector bodies are made of extruded aluminum plated with tin, while the slide nut and slide screw or pivot screw are each made of steel or aluminum. Of course, one skilled in the art will understand that other materials that are strong and durable may also be used in accordance with the present invention. For example, suitable materials include aluminum alloys known by the standard designations 6061, 6063 or 6101 alloys.

Termination connectors 272, 1100 and 1200 may be formed by any suitable manufacturing process that is appropriate for the selected material and provides the desired material characteristics for the various elements of the connectors. For example, in some embodiments, an extrusion process is used in which the cross-sectional shape of a connector body is extruded. The extrusion may be cut to selected lengths for convenient handling, as well as treated for desired material characteristics, including desired strength, hardness, stiffness, elasticity, and the like. Such treatments may include heat treating. The treated extrusion lengths are then cut or sliced into the individual connector bodies. Finally, surfaces of the connector bodies are finished, which may include deburring, polishing, chemical cleaning, and tinning or plating with other metals. By using an extrusion process, it is possible to economically vary the thickness and shape of the connector bodies, permitting better mechanical, electrical and thermal performance.

Each of the termination connectors described above is preferably configured to receive and terminate conductors having a diameter in a range from about 2.052 millimeters (12 AWG) to about 19.67 millimeters (600 kcmil), and preferably in a range from about 5.189 millimeters (4 AWG) to about 15.03 millimeters (350 kcmil). The conductors typically comprise stranded copper or aluminum wires surrounded by insulation having an industry standard thickness (THHN, THWN), although other types of stranded or solid wire may also be received and terminated using the termination connectors disclosed herein. Each of the termination connectors is used to terminate a conductor in which the insulation at the end of the conductor has been stripped prior to laying the conductor in the connector body. Of course, the termination connectors could alternatively have insulation-piercing capabilities, such as those described in U.S. Pat. No. 10,886,638.

Figure 14:
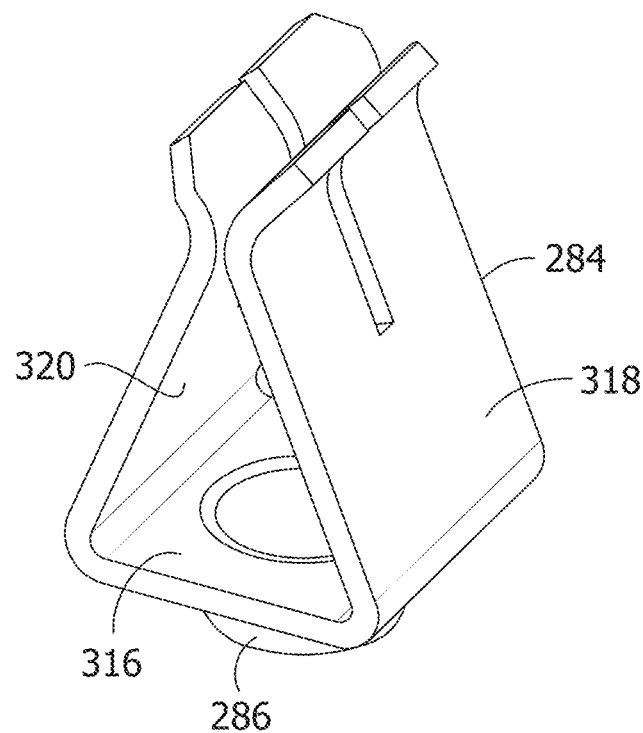
FIG. 14 is a perspective view of the back side of the meter saw shown in FIG. 10.
Figure 15:
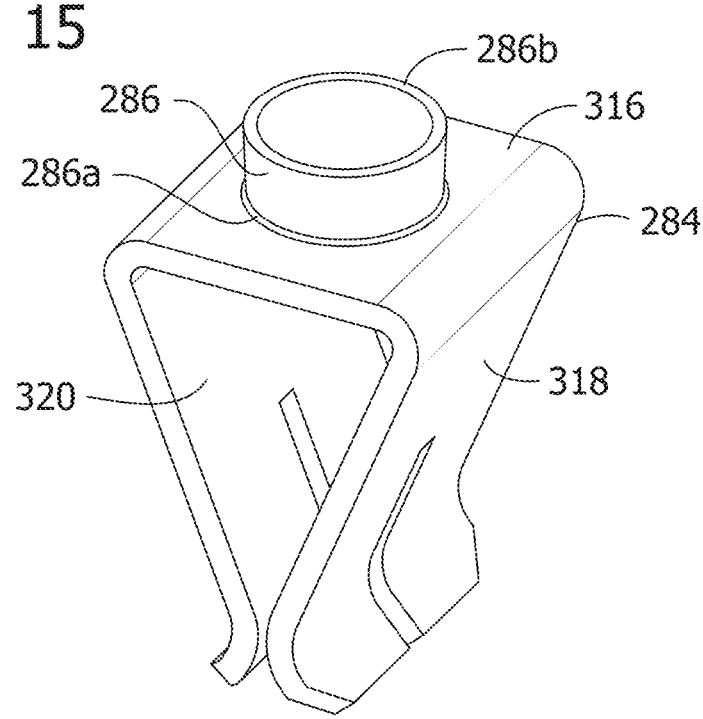
FIG. 15 is a perspective view of the front side of the meter saw shown in FIG. 10.

Referring to FIGS. 14 and 15, the configuration of meter jaw 284 of top electrical connector 254 will now be described in greater detail. One skilled in the art will appreciate that meter jaw 300 of bottom electrical connector 256 has the same configuration as that of top electrical connector 254 and will not be separately described herein.

Meter jaw 284 includes a base 316 with a pair of resilient meter jaw contacts 318 and 320 extending from the side edges of base 316. Meter jaw contacts 318 and 320 define a space therebetween for receiving the top right connector blade 106 of meter 100 (shown in FIG. 2). As best shown in FIG. 15, meter jaw 284 includes a cylindrical boss 286 that extends between a first end 286a proximal to base 316 and a second end 286b distal to base 316. Boss 286 may be formed integrally with base 316 or may be joined to base 316 in any suitable manner. The dimensions of the first end 286a of boss 286 are substantially the same as the dimensions of the second end 286b of boss 286 prior to the assembly of meter jaw 284 and termination connector 272; however, it will be seen that boss 286 is deformed during the assembly of meter jaw 284 and termination connector 272 so as to create a tapered cylinder in which the dimensions of the second end 286b of boss 286 are larger than the dimensions of the first end 286a of boss 286.

In the exemplary embodiment, meter jaw 284 is made of copper or a copper alloy. Of course, other materials may also be used within the scope of the present invention, provided that the material is both conductive and ductile so as to enable deformation of at least a portion of boss 286 during the assembly of meter jaw 284 and termination connector 272.

Meter jaw 284 may be formed by any suitable manufacturing process that is appropriate for the selected material and provides the desired material characteristics. For example, meter jaw 284 may be formed in a progressive die or multi-slide tooling. Boss 286 comprises an extruded hole that is formed by creating a small (e.g., 0.062 inch) pilot hole followed by a rounded punch that extrudes the material into a hole in the die, as known to one skilled in the art.

One skilled in the art will appreciate that the present invention is not limited to the structural configuration of meter jaw 284 and that other meter jaws may be used within the scope of the present invention.

A method of making electrical connector 254 in accordance with an exemplary embodiment of the present invention will now be described with reference to FIGS. 16A-16C, FIGS. 17A-17C, and FIGS. 18A-18C. In this embodiment, a punch 400 is used to secure meter jaw 284 to termination connector 272. Punch 400 extends between a first end 402 and a second end 404 and is tapered such that the diameter of the first end 402 is less than the diameter of the second end 404. Punch 400 has an octagonal cross-section so as to form eight flat sides 406 on the outer surface of punch 400, wherein each of sides 406 extends longitudinally between the first end 402 and the second end 404. Punch 400 is made of tool steel, although other materials may be used within the scope of the present invention. It can be appreciated that punch 400 is part of a punch tool that is used to manufacture the meter jaw and termination connector assembly of the present invention using manufacturing techniques known to one skilled in the art.

Figure 16A:
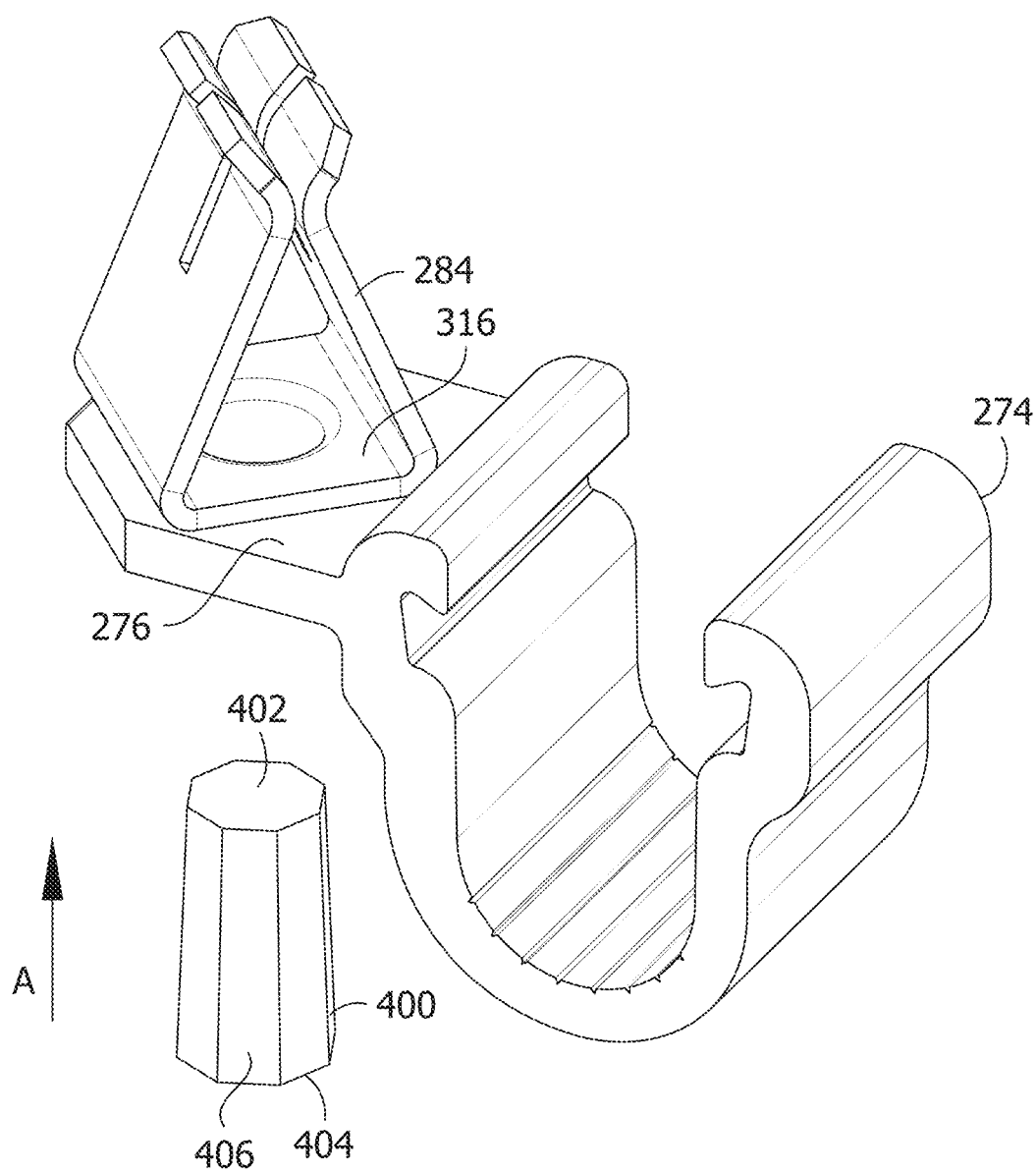
FIGS. 16A-16C are various views of the meter saw connected to the termination connector prior to insertion of a punch, including a perspective view (FIG. 16A), a perspective cutaway view (FIG. 16B), and a side cutaway view (FIG. 16C)
Figure 16B:
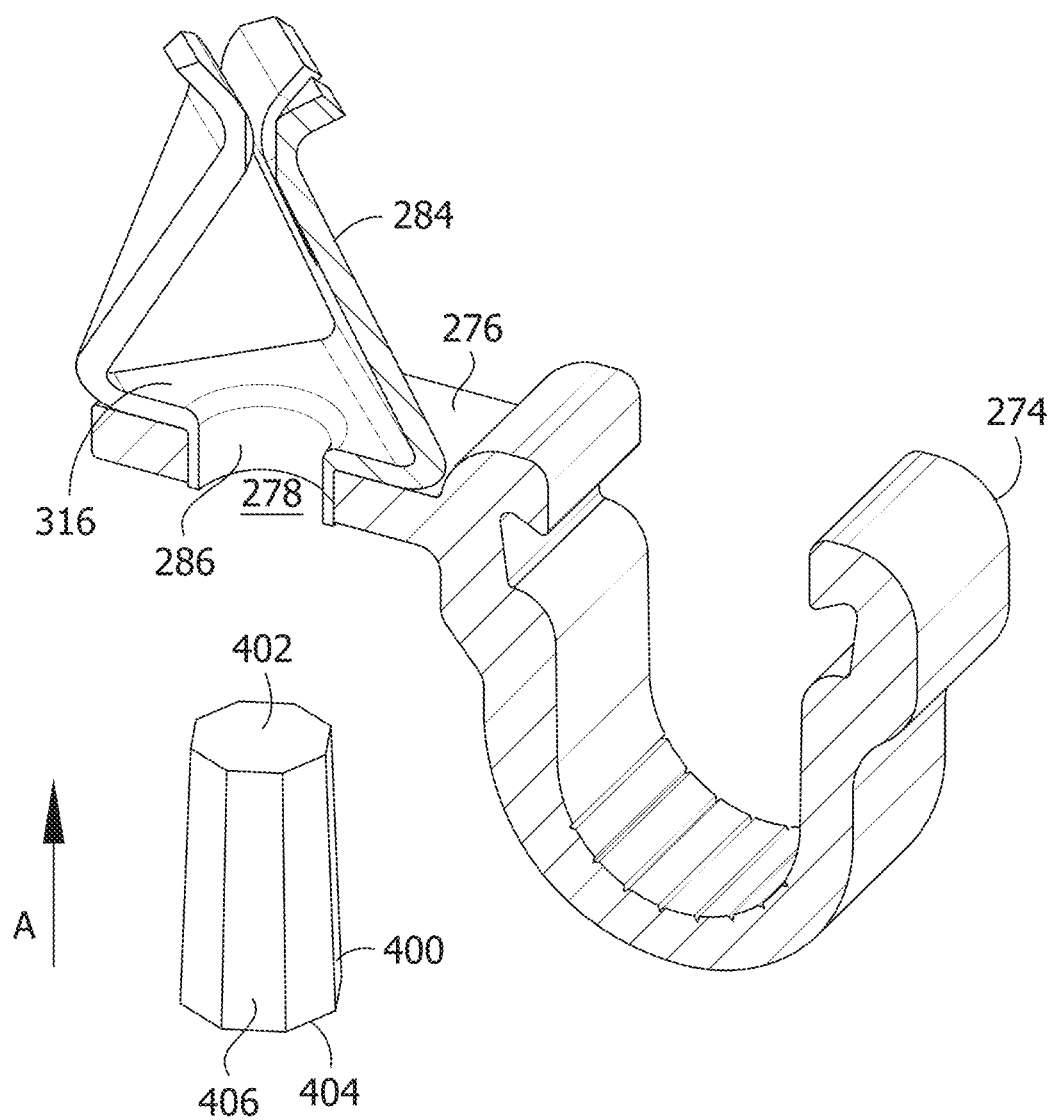
Figure 16C:
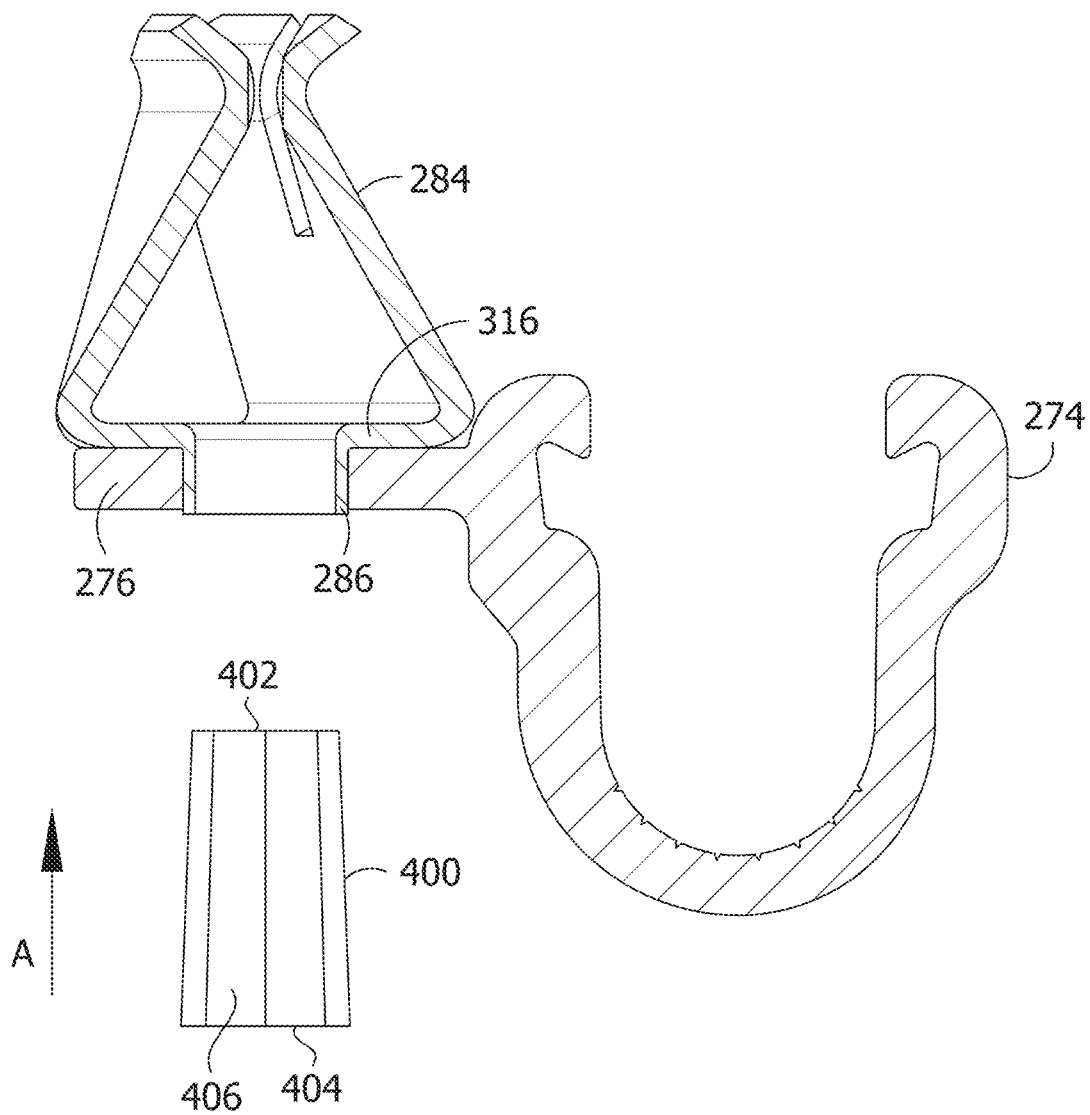

FIGS. 16A-16C show meter jaw 284 and connector body 274 of termination connector 272 prior to the insertion of punch 400 in the direction of arrow A. As best shown in FIGS. 16B and 16C, boss 286 of meter jaw 284 is inserted through the opening 278 of connector tab 276 until the bottom surface of the meter jaw's base 316 abuts the top surface of connector tab 276. In this embodiment, the height of boss 286 is slightly greater than the height of the opening 278 so that a small portion of boss 286 extends beyond the bottom surface of connector tab 276. Of course, in other embodiments, boss 286 may not protrude through opening 278. Also, the outside diameter of boss 286 is slightly less than the diameter of the opening 278 to enable the insertion of boss 286 through the opening 278 (wherein the difference between the diameters is so small that it cannot be seen in FIGS. 16A-16C).

Figure 17A:
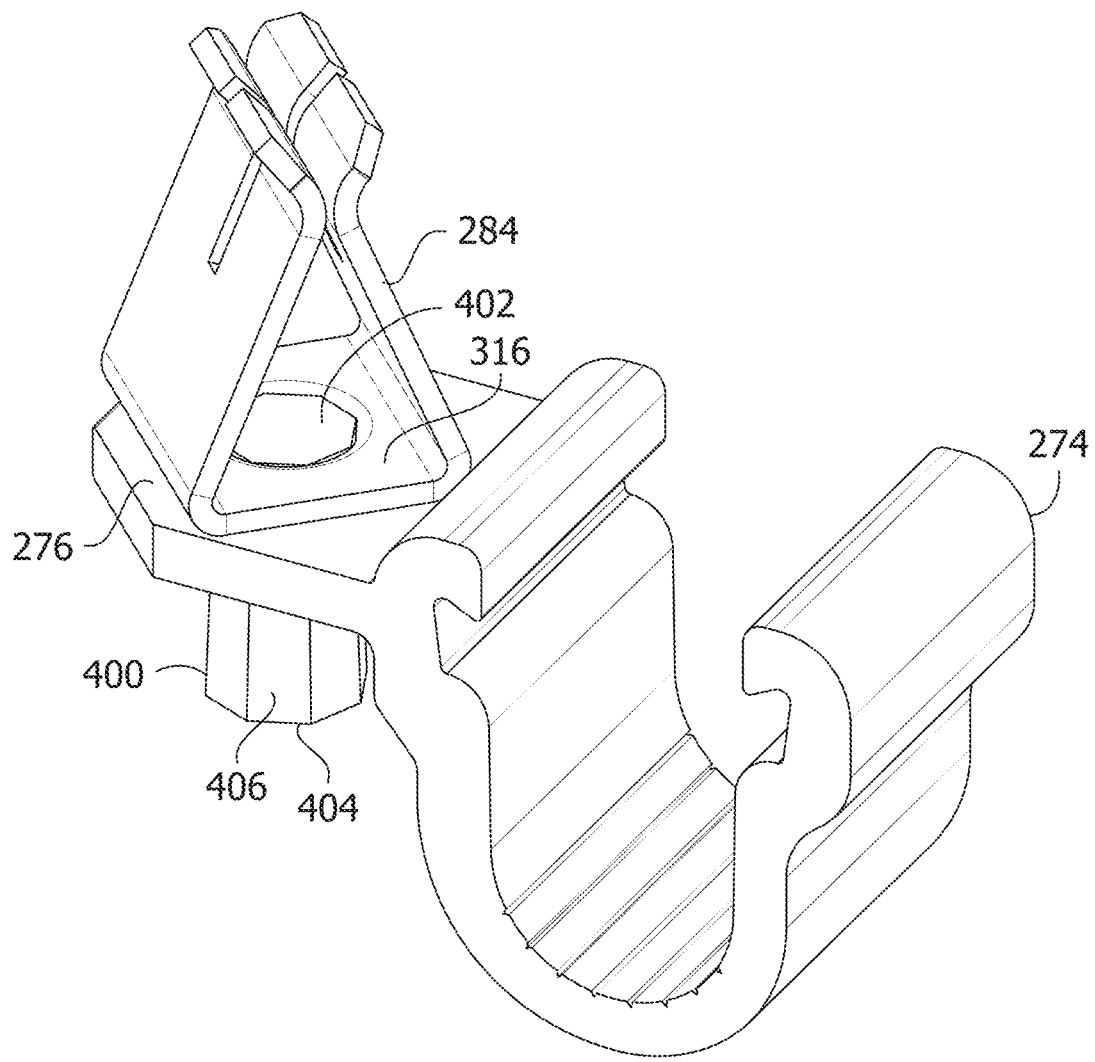
FIGS. 17A-17C are various views of the meter saw connected to the termination connector during insertion of the punch, including a perspective view (FIG. 17A), a perspective cutaway view (FIG. 17B), and a side cutaway view (FIG. 17C)
Figure 17B:
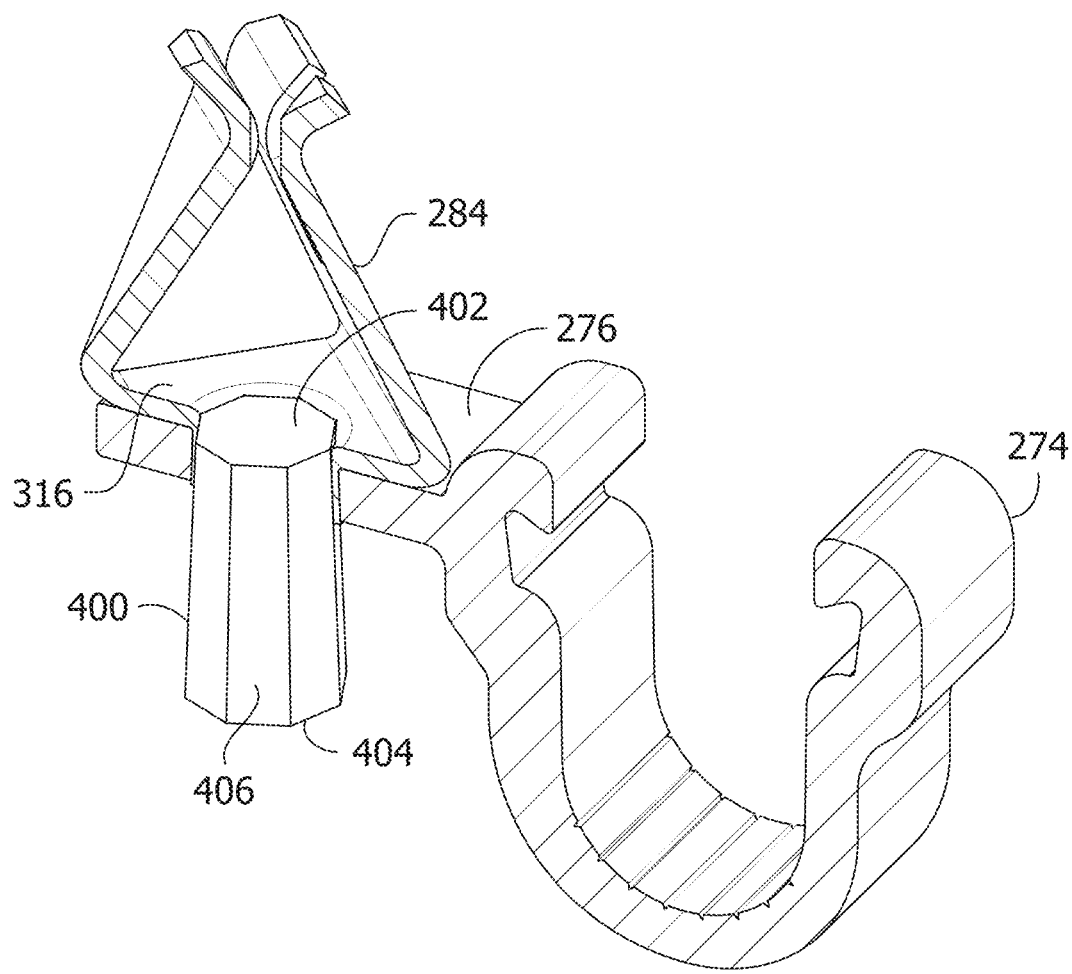
Figure 17C:
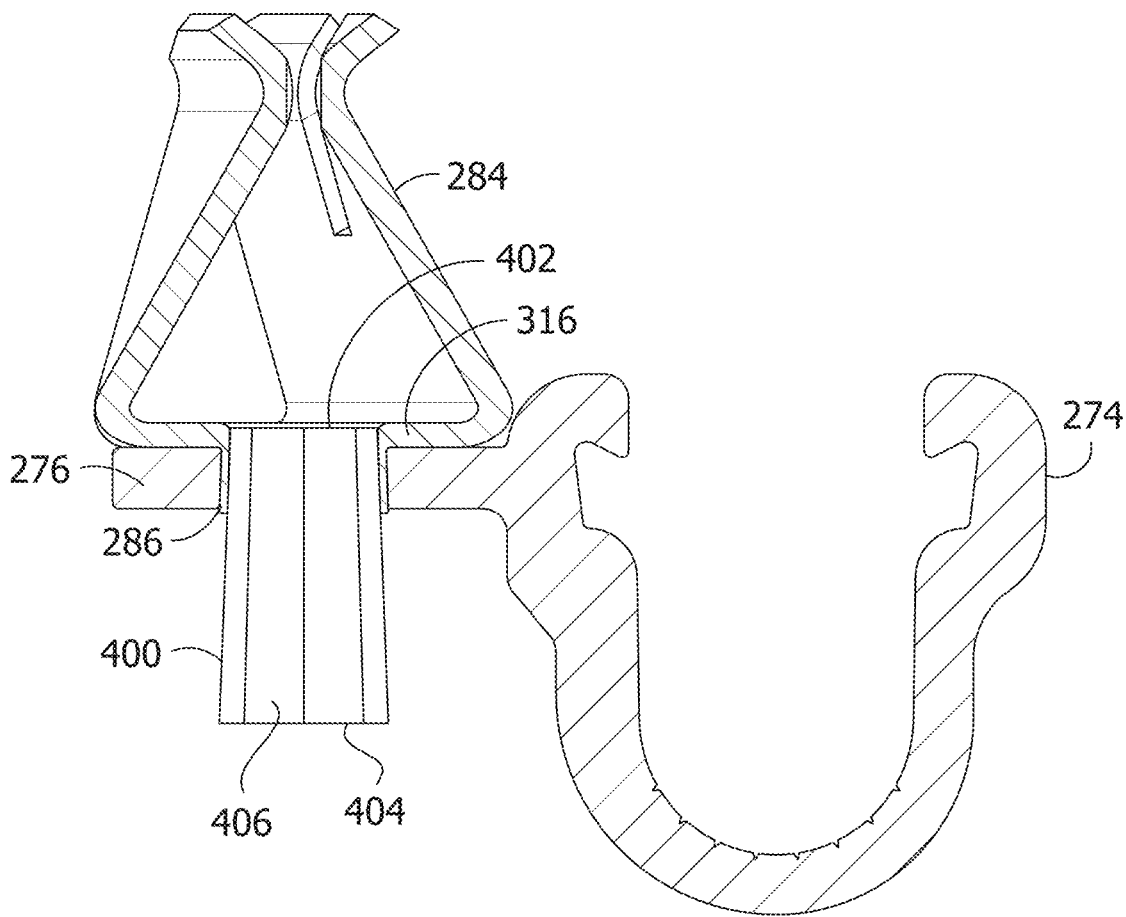

FIGS. 17A-17C show meter jaw 284 and connector body 274 of termination connector 272 during the insertion of punch 400 into boss 286. The first end 402 of punch 400 has a diameter that is slightly less than the inside diameter of boss 286 to enable the insertion of a portion of punch 400 through boss 286. Because punch 400 tapers outwardly from the first end 402 toward the second end 404, a portion of the outer surface of punch 400 will contact and cause expansion of boss 286 as punch 400 travels through boss 286, thereby deforming boss 286 in a conical fashion. This expansion causes boss 286 and the inner wall 309 of connector tab 276 to be swaged together. Thus, boss 286 is secured to the inner wall 309 of connector tab 276 so as to mechanically, electrically and thermally connect meter jaw 284 to termination connector 272. It should be understood that the force used to insert punch 400 into boss 286 should be selected to achieve a good connection between boss 286 and connector tab 276 while not breaking the respective parts.

Figure 18A:
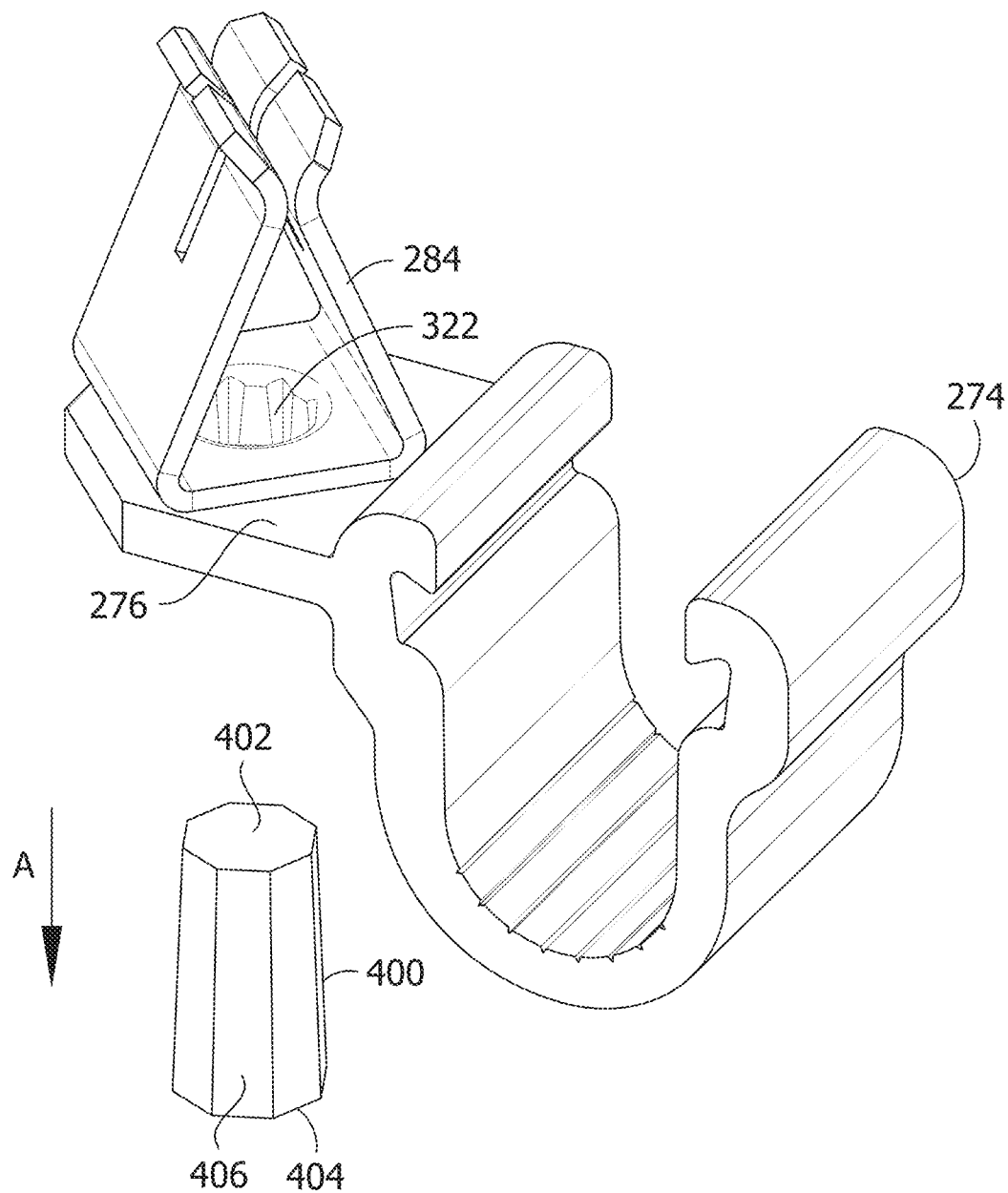
FIGS. 18A-18C are various views of the meter saw connected to the termination connector after removal of the punch, including a perspective view (FIG. 18A), a perspective cutaway view (FIG. 18B), and a side cutaway view (FIG. 18C)
Figure 18B:
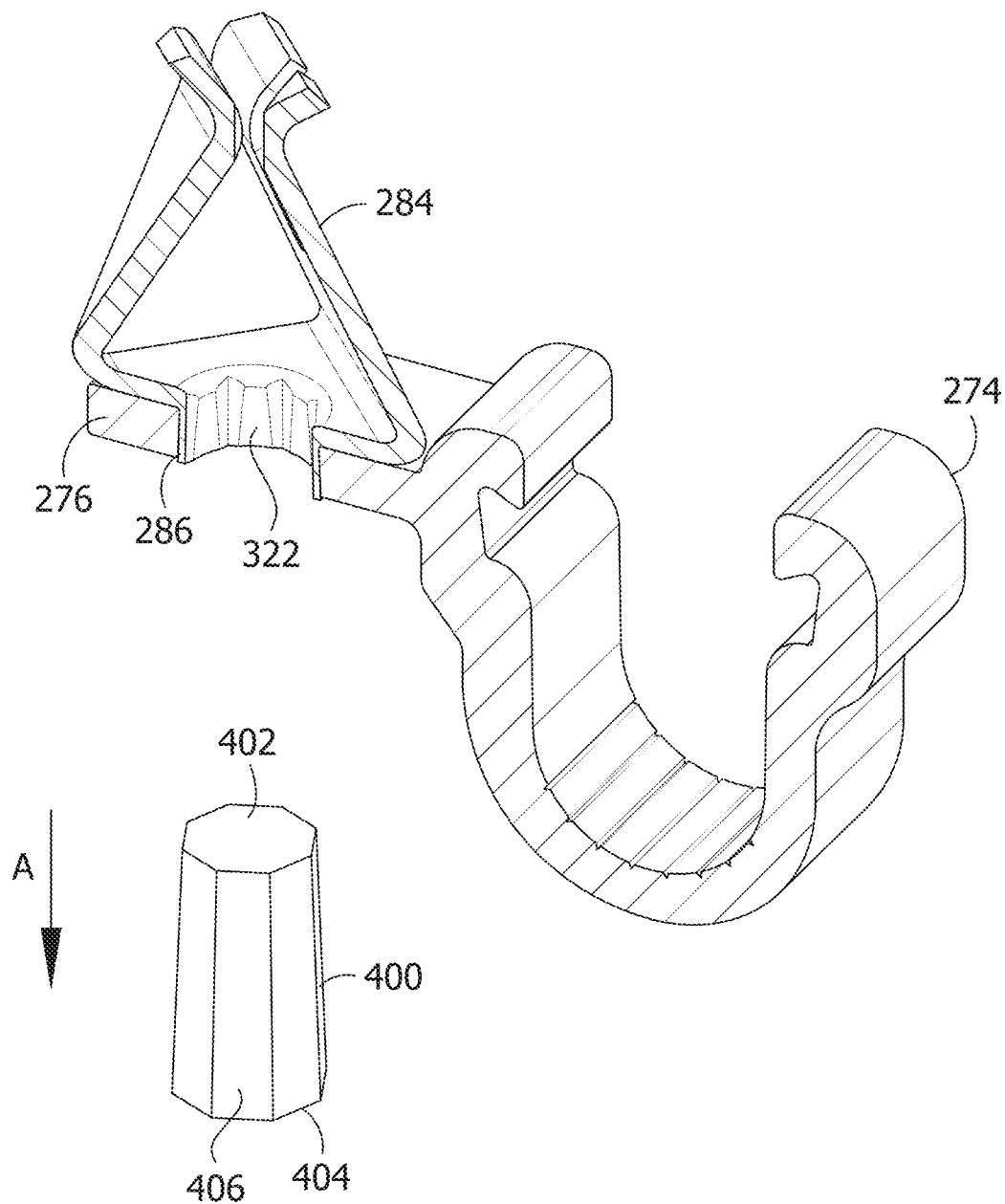
Figure 18C:
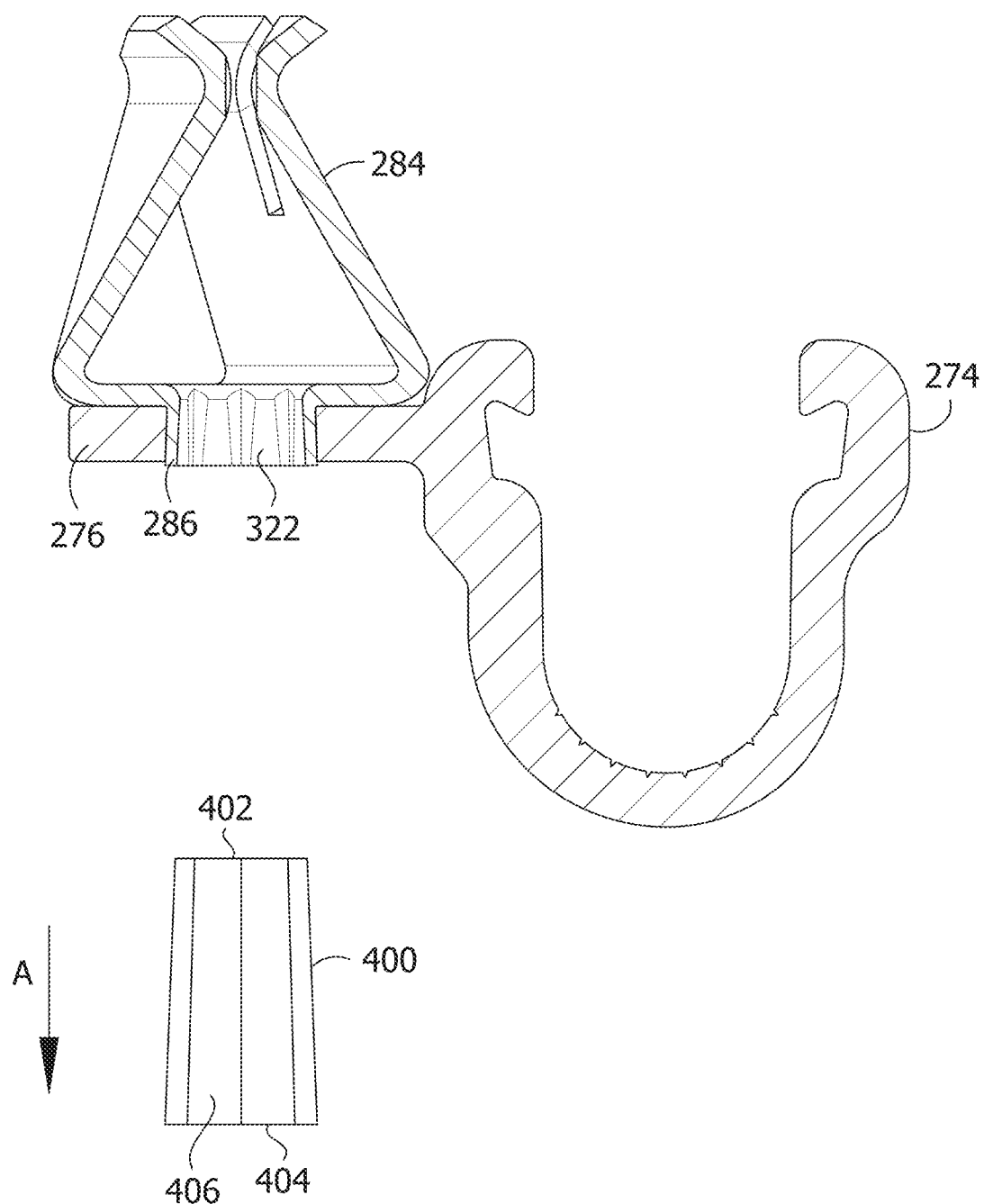

FIGS. 18A-18C show meter jaw 284 and connector body 274 of termination connector 272 after removal of punch 400 in the direction of arrow A. As best shown in FIG. 18C, boss 286 now forms a tapered cylinder (created by the tapered configuration of punch 400) in which at least a portion of boss 286 engages the inner wall 309 of connector tab 276 to create an interference fit therebetween, thereby preventing longitudinal movement of meter jaw 284 relative to termination connector 272. It can also be seen that boss 286 now includes deformations 322 (created by the eight sides on the outer surface of punch 400) that translate through to the inner wall 309 of connector tab 276 to rotationally lock boss 286 to connector tab 276, thereby preventing rotational movement of meter jaw 284 relative to termination connector 272.

A method of making electrical connector 254 in accordance with an alternative embodiment of the present invention will now be described with reference to FIGS. 19A-19C, FIGS. 20A-20C, and FIGS. 21A-21C. In this embodiment, a punch 500 is used to secure meter jaw 284 to termination connector 272. Punch 500 extends between a first end 502 comprising a rounded head and a second end 504 and is tapered such that the diameter of the first end 502 is less than the diameter of the second end 504. Punch 500 has eight facets 506 on the outer surface of punch 500, as shown. Punch 500 is made of tool steel, although other materials may be used within the scope of the present invention. It can be appreciated that punch 500 is part of a punch tool that is used to manufacture the meter jaw and termination connector assembly of the present invention using manufacturing techniques known to one skilled in the art.

Figure 19A:
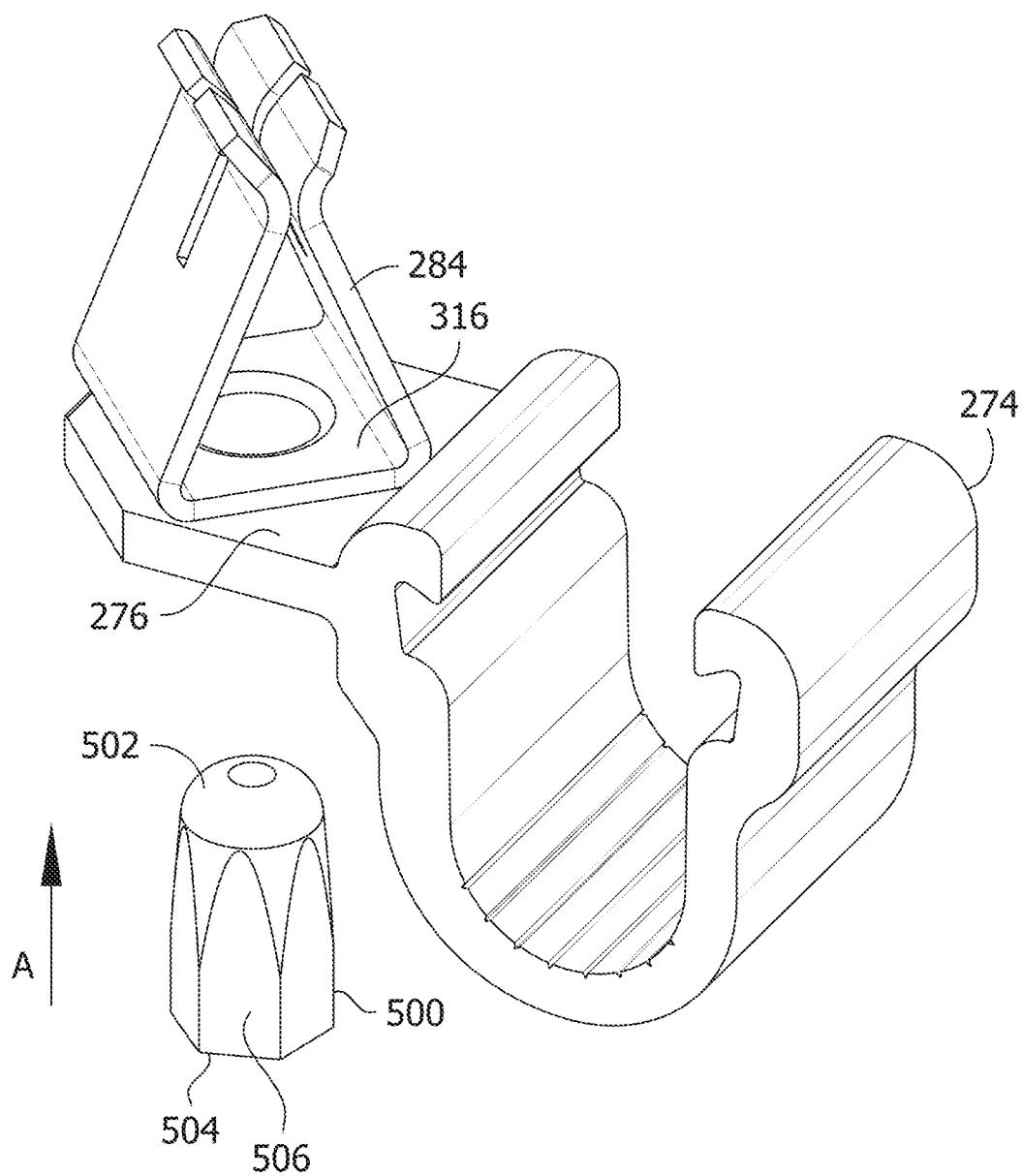
FIGS. 19A-19C are various views of the meter saw connected to the termination connector prior to insertion of an alternative punch, including a perspective view (FIG. 19A), a perspective cutaway view (FIG. 19B), and a side cutaway view (FIG. 19C)
Figure 19B:
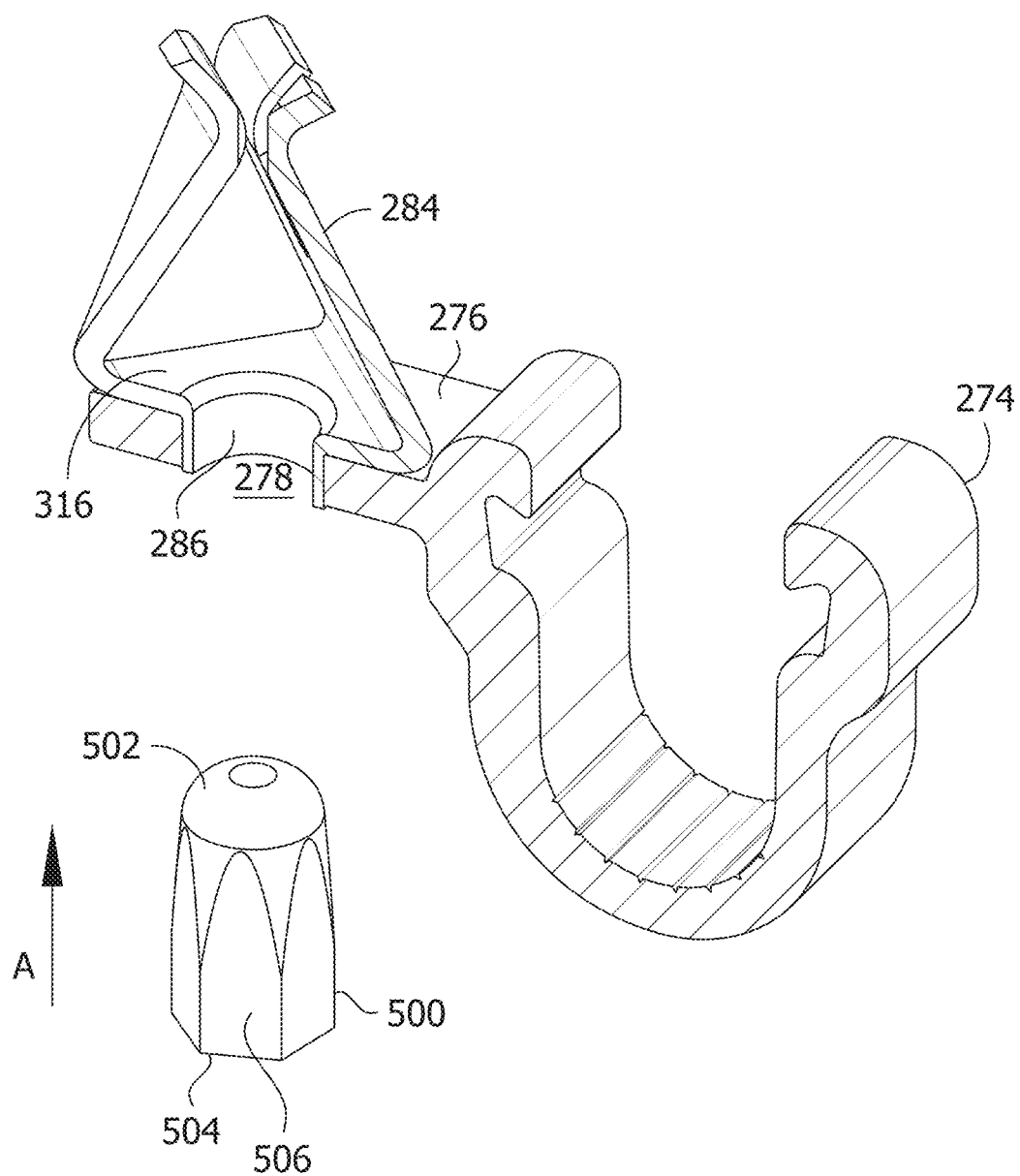
Figure 19C:
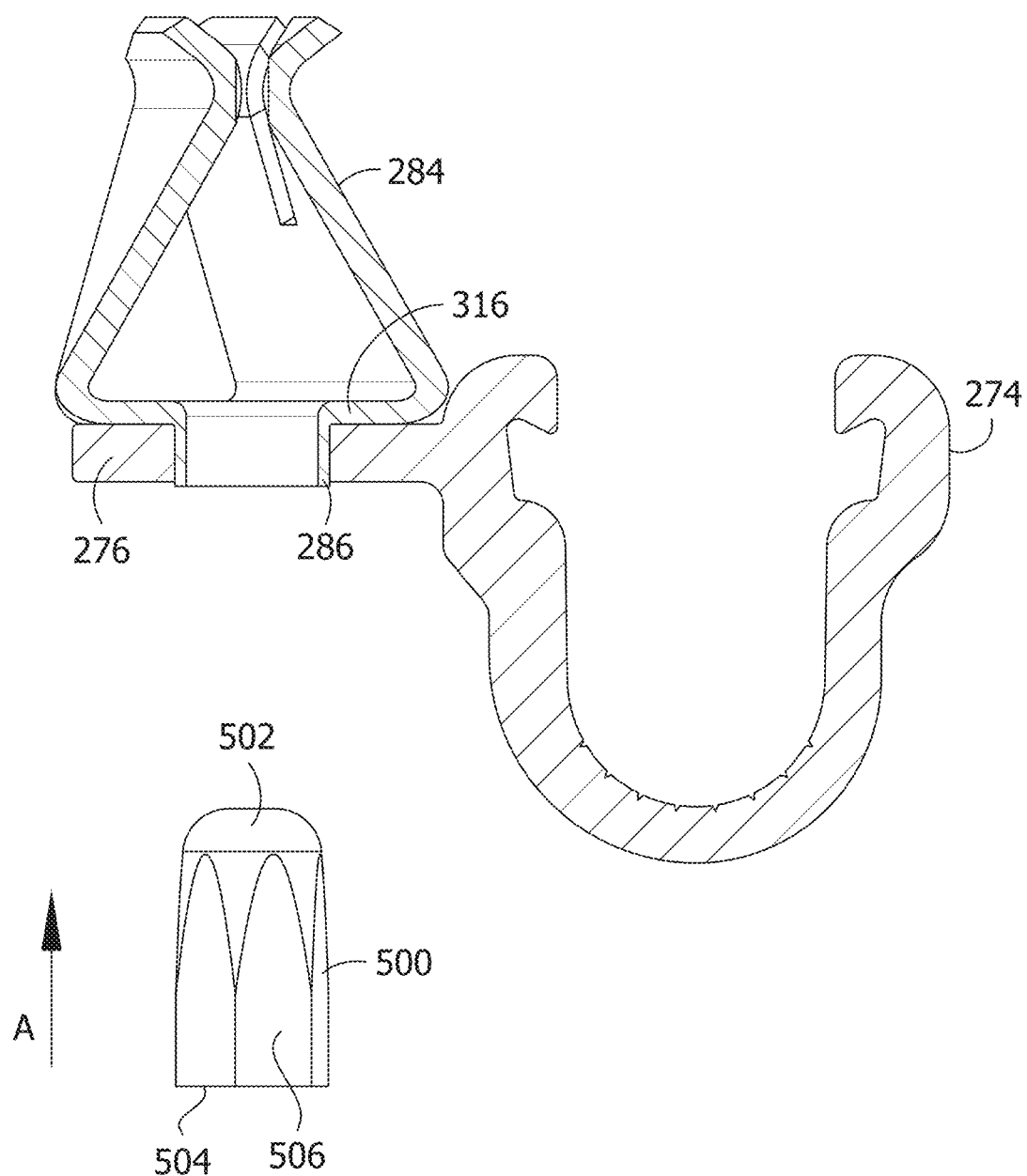

FIGS. 19A-19C show meter jaw 284 and connector body 274 of termination connector 272 prior to the insertion of punch 500 in the direction of arrow A. As best shown in FIGS. 19B and 19C, boss 286 of meter jaw 284 is inserted through the opening 278 of connector tab 276 until the bottom surface of the meter jaw's base 316 abuts the top surface of connector tab 276. In this embodiment, the height of boss 286 is slightly greater than the height of the opening 278 so that a small portion of boss 286 extends beyond the bottom surface of connector tab 276. Of course, in other embodiments, boss 286 may not protrude through opening 278. Also, the outside diameter of boss 286 is slightly less than the diameter of the opening 278 to enable the insertion of boss 286 through the opening 278 (wherein the difference between the diameters is so small that it cannot be seen in FIGS. 19A-19C).

Figure 20A:
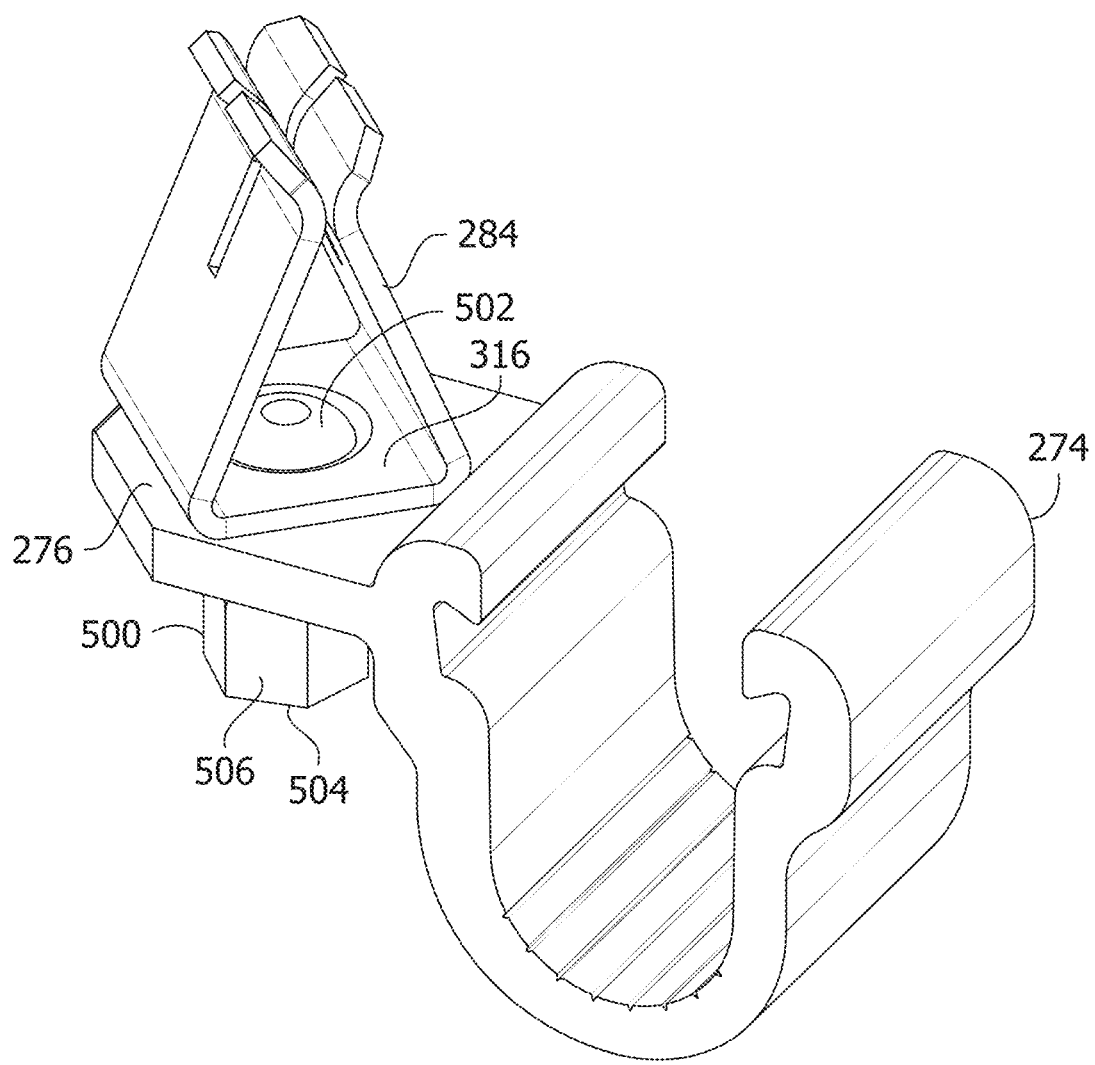
FIGS. 20A-20C are various views of the meter saw connected to the termination connector during insertion of the alternative punch, including a perspective view (FIG. 20A), a perspective cutaway view (FIG. 20B), and a side cutaway view (FIG. 20C)
Figure 20B:
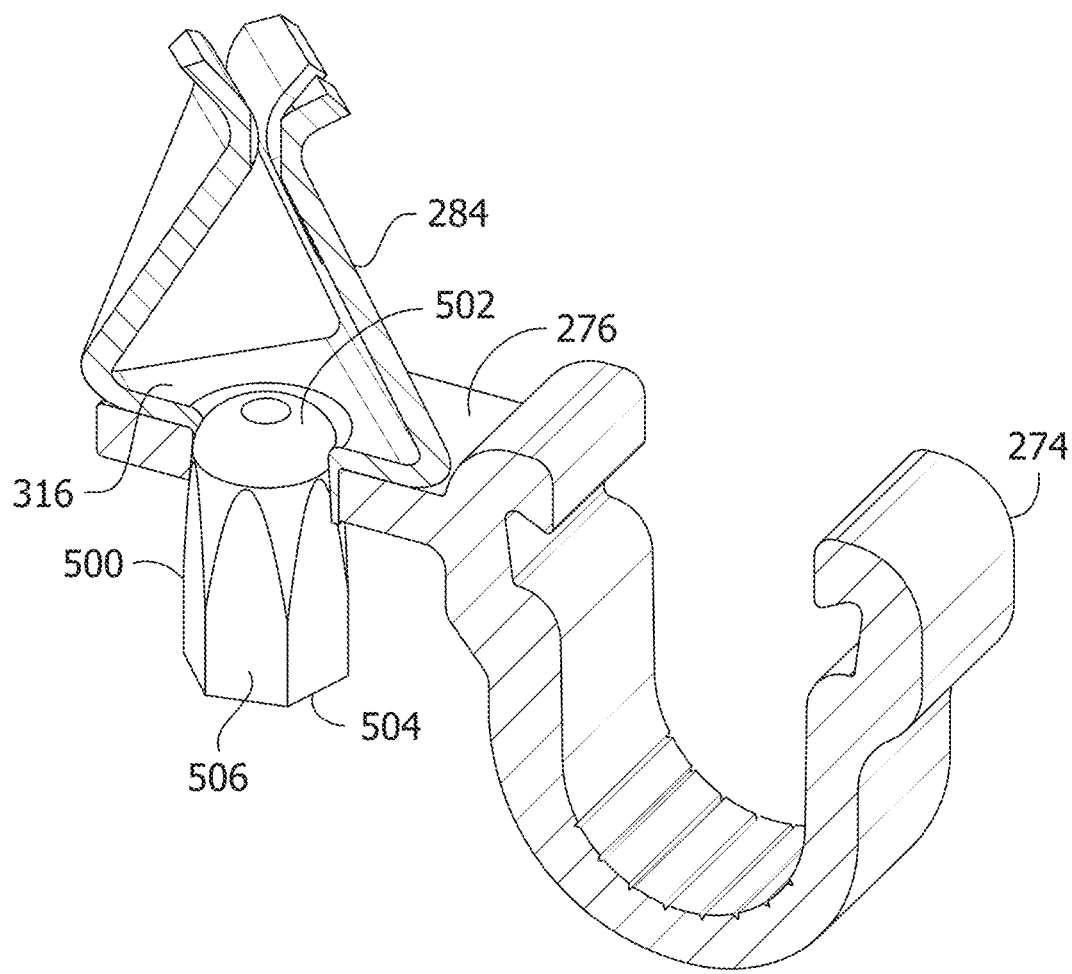
Figure 20C:
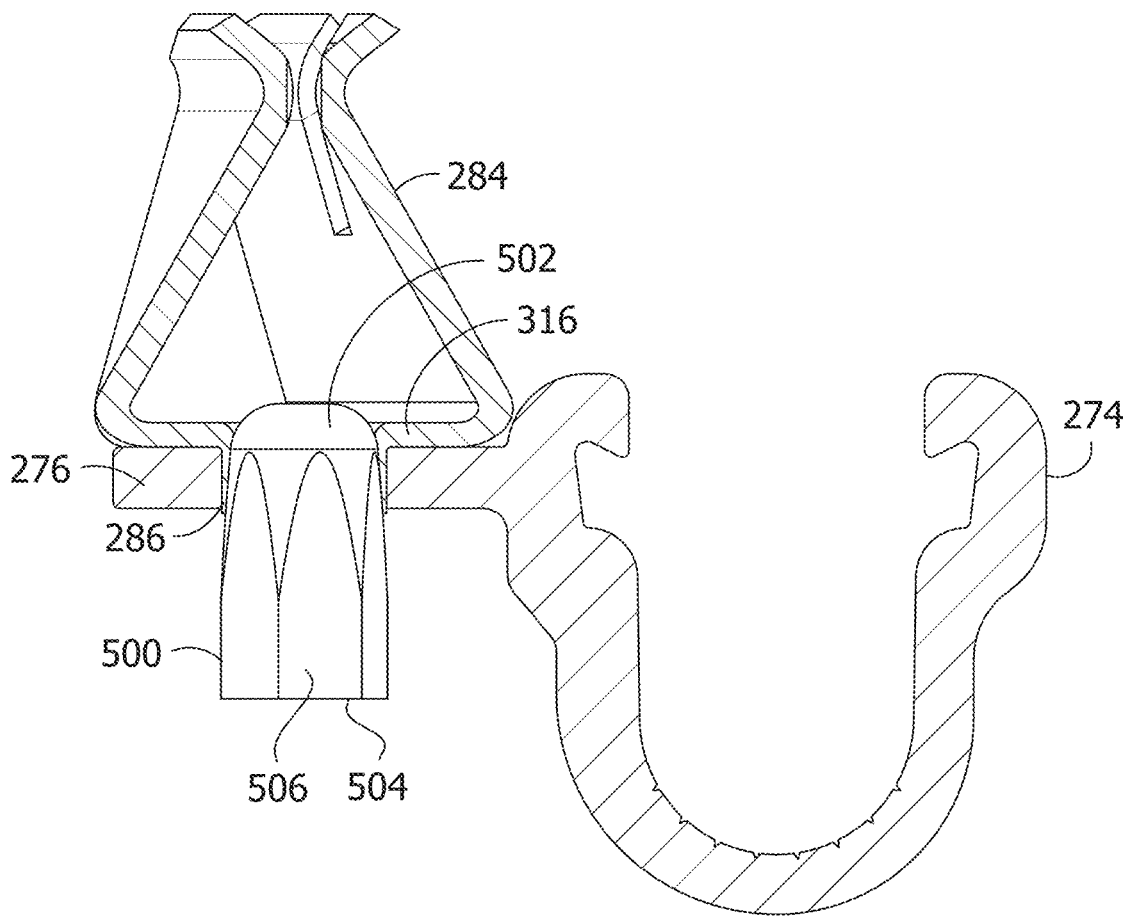

FIGS. 20A-20C show meter jaw 284 and connector body 274 of termination connector 272 during the insertion of punch 500 into boss 286. The first end 502 of punch 500 has a diameter that is slightly less than the inside diameter of boss 286 to enable the insertion of a portion of punch 500 through boss 286. Because punch 500 tapers outwardly from the first end 502 toward the second end 504, a portion of the outer surface of punch 500 will contact and cause expansion of boss 286 as punch 400 travels through boss 286, thereby deforming boss 286 in a conical fashion. This expansion causes boss 286 and the inner wall 309 of connector tab 276 to be swaged together. Thus, boss 286 is secured to the inner wall 309 of connector tab 276 so as to mechanically, electrically and thermally connect meter jaw 284 to termination connector 272. It should be understood that the force used to insert punch 500 into boss 286 should be selected to achieve a good connection between boss 286 and connector tab 276 while not breaking the respective parts.

Figure 21A:
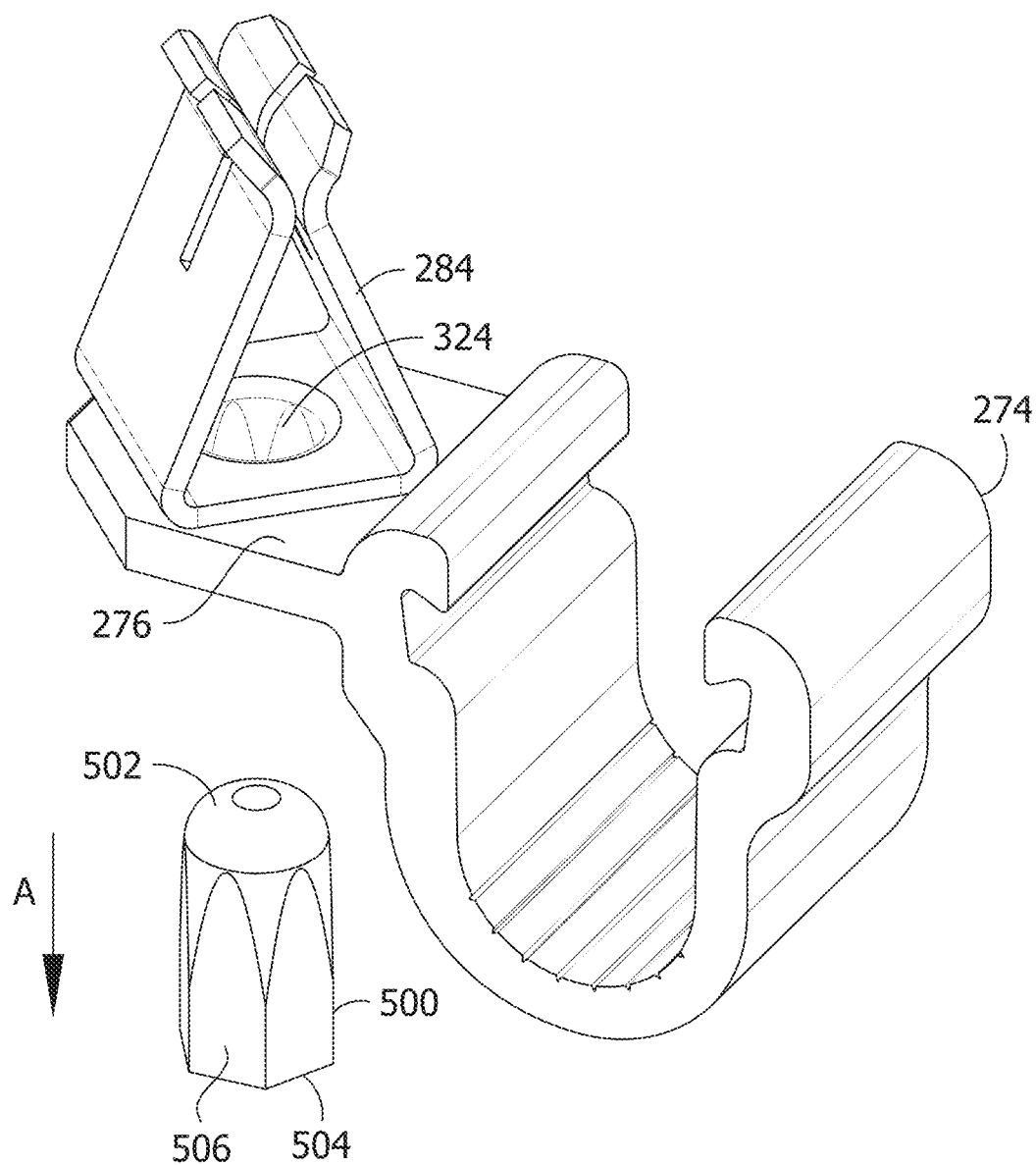
FIGS. 21A-21C are various views of the meter saw connected to the termination connector after removal of the alternative punch, including a perspective view (FIG. 21A), a perspective cutaway view (FIG. 21), and a side cutaway view (FIG. 21C).
Figure 21B:
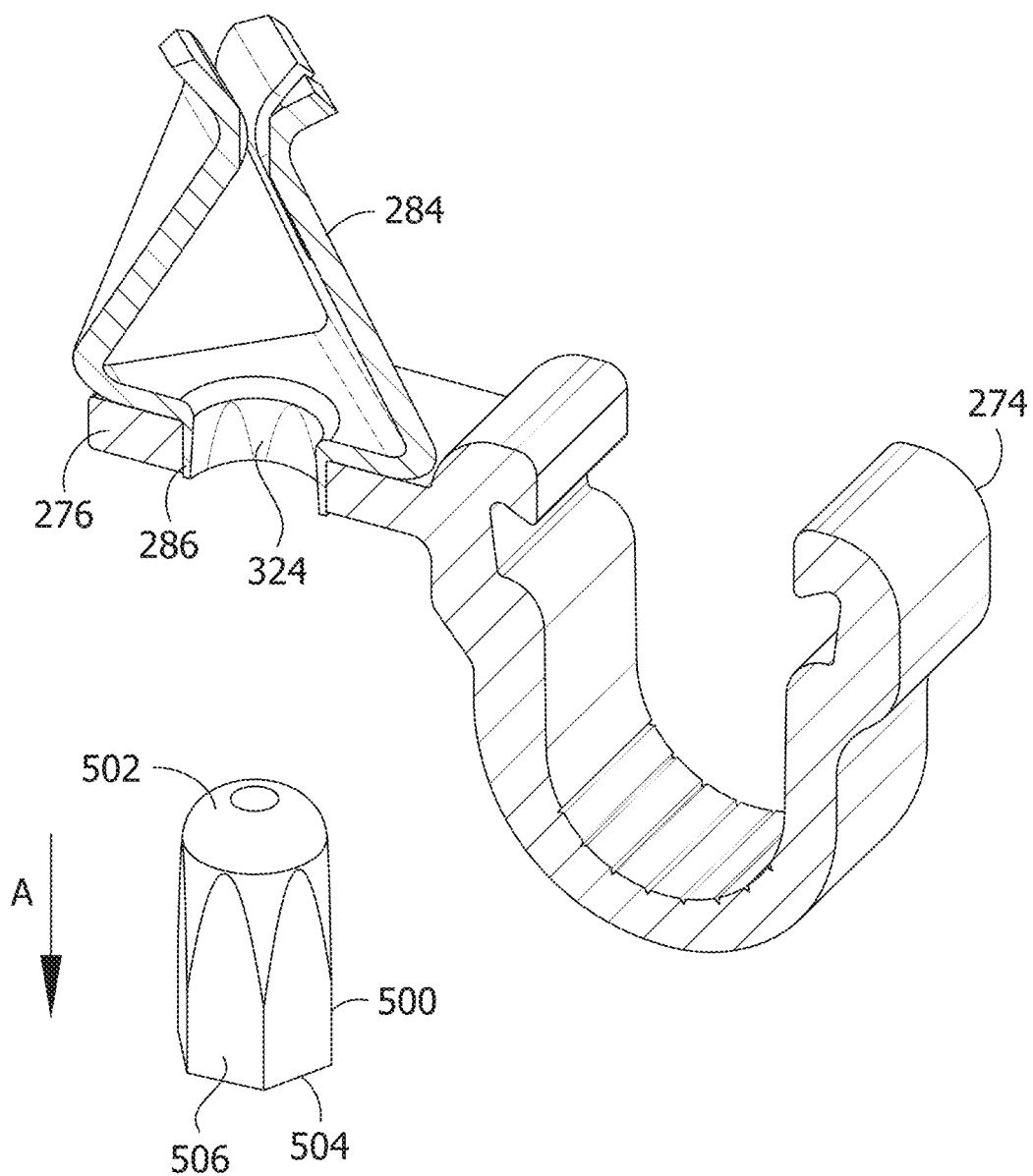
Figure 21C:
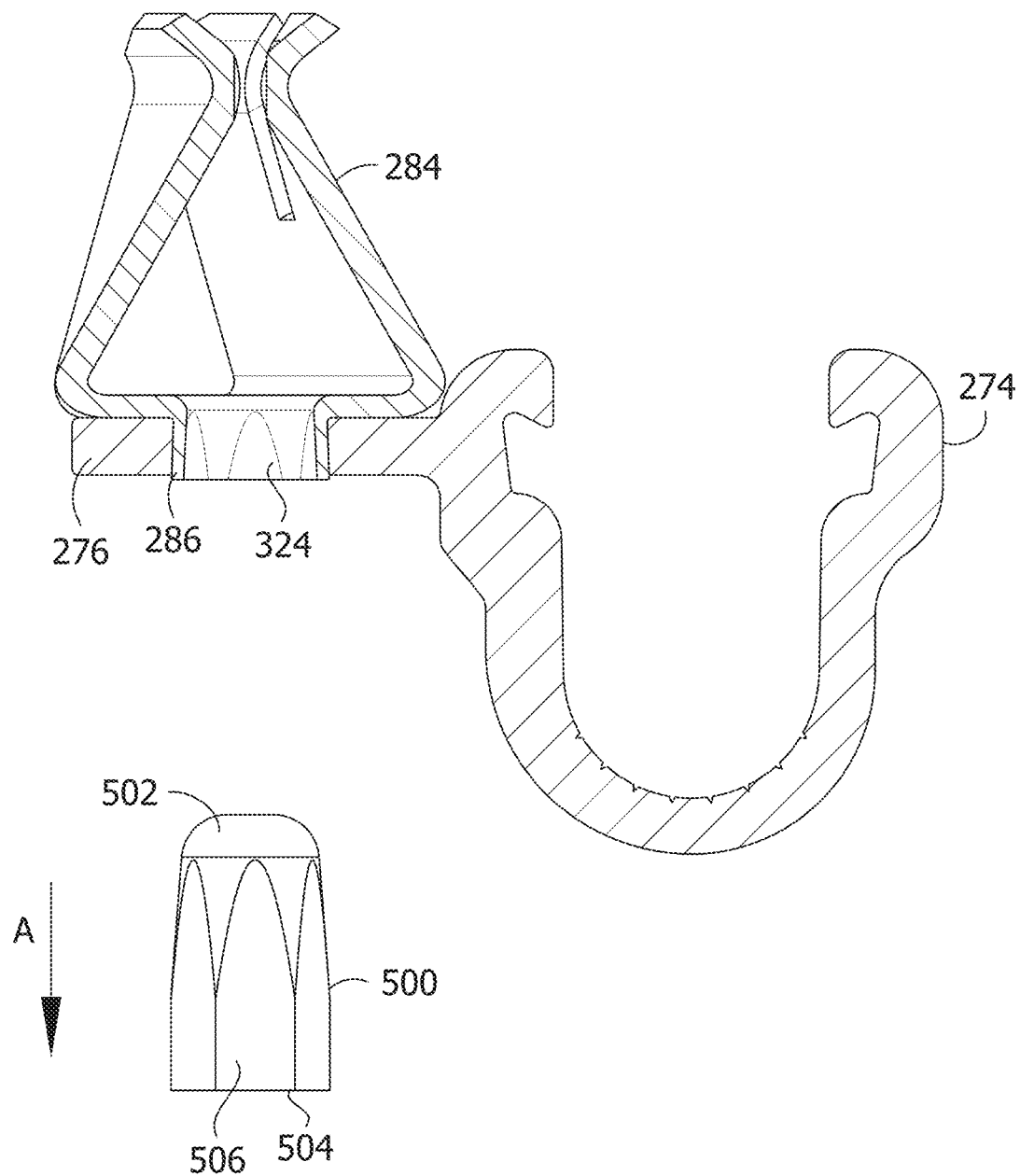

FIGS. 21A-21C show meter jaw 284 and connector body 274 of termination connector 272 after removal of punch 500 in the direction of arrow A. As best shown in FIG. 21C, boss 286 now forms a tapered cylinder (created by the tapered configuration of punch 500) in which at least a portion of boss 286 engages the inner wall 309 of connector tab 276 to create an interference fit therebetween, thereby preventing longitudinal movement of meter jaw 284 relative to termination connector 272. It can also be seen that boss 286 now includes deformations 324 (created by the eight facets on the outer surface of punch 500) that translate through to the inner wall 309 of connector tab 276 to rotationally lock boss 286 to connector tab 276, thereby preventing rotational movement of meter jaw 284 relative to termination connector 272.

One skilled in the art will appreciate that the present invention is not limited to the structural configuration of punch 400 and punch 500 and the resultant structural configuration of boss 286 of meter jaw 284 as shown in FIGS. 18A-18C and FIGS. 21A-21C, respectively. For example, a punch could be used that has a tapered configuration with a smooth outer surface, which creates a corresponding tapered configuration in boss 286 of meter jaw 284. In this case, the tapered configuration of boss 286 would prevent longitudinal movement of meter jaw 284 relative to termination connector 272. Also, the outer surface of the punch could have other features that cause corresponding deformations in boss 286 of meter jaw 284 to prevent rotational movement of meter jaw 284 relative to termination connector 272. Of course, other punch configurations will become apparent to one skilled in the art.

In all of the embodiments described above, one skilled in the art will appreciate that additional fasteners (such as a bolt and/or jaw nut) are not required to secure the meter jaw to the termination connector, which reduces material and labor costs for manufacture of the assembly. The structural configuration of the electrical connector also provides improved performance characteristics, e.g., the direct connection between the meter jaw and termination connector connection offers good electrical conductivity and thermal conductivity, which results in a lower temperature rise and higher performance of the electrical connector.

The performance of the new electrical connector described in detail above in connection with FIGS. 11, 14-15, 16A-16C, 17A-17C and 18A-18C was tested and compared to the performance of the standard electrical connector shown in FIG. 1 using a Keysight 34420A multimeter available from Keysight Technologies, Inc. of Santa Rosa, California. Fourteen samples of the new electrical connector were tested, each of which comprised a meter jaw made from copper alloy secured to a termination connector made from aluminum. Fourteen samples of the standard electrical connector were also tested, each of which comprised a meter jaw made from copper alloy secured to a termination connector made from aluminum. For each of the samples, one lead of the multimeter was clamped to one of the resilient contacts of the meter jaw and the other lead of the multimeter was clamped to one of the legs of the U-shaped connector body of the termination connector, and then the resistance between them was measured in micro-ohms (pLQ). The results of the resistance tests are shown in Table 1 below:

TABLE 1

| Standard Connector (Micro-Ohms (μΩ)) | New Connector (Micro-Ohms (μΩ)) |
|---|---|
| 44 | 36 |
| 39 | 40 |
| 46 | 36 |
| 44 | 36 |
| 47 | 37 |
| 49 | 37 |
| 49 | 37 |
| 47 | 41 |
| 48 | 38 |
| 52 | 37 |
| 51 | 38 |
| 51 | 38 |
| 51 | 37 |
| 51 | 38 |
| 47.8 (average) | 37.6 (average) |

As can be seen, the average resistance for the samples of the new electrical connector was about 21% lower than the average resistance for the samples of the standard electrical connector. This demonstrates that the new electrical connector provides a meter jaw-termination connector connection with improved electrical conductivity, which results in a lower temperature rise and higher performance of the electrical connector.

II. General

The description set forth above provides several exemplary embodiments of the inventive subject matter. Although each exemplary embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The use of any and all examples or exemplary language provided with respect to certain embodiments is intended merely to better describe the present invention and does not pose a limitation on the scope of the invention. No language in the description should be construed as indicating any non-claimed element essential to the practice of the present invention.

The use of relative relational terms, such as first and second, top and bottom, and left and right, are used solely to distinguish one unit or action from another unit or action without necessarily requiring or implying any actual such relationship or order between such units or actions.

The use of the terms "comprises," "comprising," or any other variation thereof, are intended to cover a non-exclusive inclusion, such that a system or method that comprises a list of elements does not include only those elements, but may include other elements not expressly listed or inherent to such system or method.

While the present invention has been described and illustrated hereinabove with reference to several exemplary embodiments, it should be understood that various modifications could be made to these embodiments without departing from the scope of the invention. Therefore, the present

What is claimed and desired to be secured by Letters Patent is as follows:

1. A meter socket, comprising:
a meter socket enclosure; and
a plurality of meter jaw block assemblies mounted within the meter socket enclosure, wherein each of the meter jaw block assemblies comprises a line-side electrical connector, a load-side electrical connector, and an insulating mounting block configured to support the line-side electrical connector and the load-side electrical connector, wherein the line-side electrical connector and the load-side electrical connector each comprise: (a) a termination connector configured to receive a conductor, wherein the termination connector includes a connector tab with an opening formed therein and (b) a meter jaw configured to receive a connector blade of an electric meter, wherein the meter jaw includes a boss positioned within the opening and secured to the connector tab so as mechanically, electrically and thermally connect the meter jaw to the termination connector.

2. The meter socket of claim 1, wherein the meter jaw comprises a base with a pair of resilient contacts extending therefrom for receiving the connector blade of the electric meter, and wherein the boss comprises a cylinder that extends between a first end proximal to the base and a second end distal to the base.

3. The meter socket of claim 1, wherein the termination connector comprises a connector body having two spaced apart legs connected by a bight section for receiving the conductor, and wherein the connector tab extends from an outer surface of one of the legs.

4. The meter socket of claim 1, wherein the boss is secured to the connector tab so as to prevent rotational movement of the meter jaw relative to the termination connector.

5. The meter socket of claim 4, wherein the connector tab includes an inner wall that defines the opening, and wherein the boss includes one or more deformations that rotationally lock the boss to the inner wall of the connector tab.

6. The meter socket of claim 1, wherein the meter jaw is formed of a conductive material that is ductile to enable expansion of at least a portion of the boss within the opening of the connector tab.

7. The meter socket of claim 6, wherein the conductive material comprises copper or a copper alloy.

8. The meter socket of claim 1, wherein the boss is secured to the connector tab so as to prevent longitudinal movement of the meter jaw relative to the termination connector.

9. The meter socket of claim 8, wherein the boss and the connector tab are swaged together.

10. The meter socket of claim 8, wherein the connector tab includes an inner wall that defines the opening, and wherein at least a portion of the boss engages the inner wall of the connector tab to create an interference fit therebetween.

11. An electrical connector for a meter socket, comprising:
a termination connector that includes a connector tab with an opening formed therein; and
a meter jaw that includes a boss positioned within the opening and secured to the connector tab so as to mechanically, electrically and thermally connect the meter jaw to the termination connector.

12. The electrical connector of claim 11, wherein the meter jaw comprises a base with a pair of resilient contacts extending therefrom for receiving a connector blade of an electric meter, and wherein the boss comprises a cylinder that extends between a first end proximal to the base and a second end distal to the base.

13. The electrical connector of claim 11, wherein the termination connector comprises a connector body having two spaced apart legs connected by a bight section for receiving a conductor, and wherein the connector tab extends from an outer surface of one of the legs.

14. The electrical connector of claim 11, wherein the boss is secured to the connector tab so as to prevent rotational movement of the meter jaw relative to the termination connector.

15. The electrical connector of claim 14, wherein the connector tab includes an inner wall that defines the opening, and wherein the boss includes one or more deformations that rotationally lock the boss to the inner wall of the connector tab.

16. The electrical connector of claim 11, wherein the meter jaw is formed of a conductive material that is ductile to enable expansion of at least a portion of the boss within the opening of the connector tab.

17. The electrical connector of claim 16, wherein the conductive material comprises copper or a copper alloy.

18. The electrical connector of claim 11, wherein the boss is secured to the connector tab so as to prevent longitudinal movement of the meter jaw relative to the termination connector.

19. The electrical connector of claim 18, wherein the boss and the connector tab are swaged together.

20. The electrical connector of claim 18, wherein the connector tab includes an inner wall that defines the opening, and wherein at least a portion of the boss engages the inner wall of the connector tab to create an interference fit therebetween.

21. A method of making an electrical connector, comprising:
providing a termination connector that includes a connector tab with an opening formed therein;
providing a meter jaw that includes a boss projecting therefrom;
positioning the boss of the meter jaw within the opening formed in the connector tab; and
forcing a punch into the boss of the meter jaw to secure the boss of the meter jaw to the connector tab of the termination connector.

22. The method of claim 21, wherein the meter jaw comprises a base with a pair of resilient contacts extending therefrom for receiving a connector blade of an electric meter, and wherein the boss comprises a cylinder that extends between a first end proximal to the base and a second end distal to the base.

23. The method of claim 21, wherein the termination connector comprises a connector body having two spaced apart legs connected by a bight section for receiving a conductor, and wherein the connector tab extends from an outer surface of one of the legs.

24. The method of claim 21, wherein the boss is secured to the connector tab so as to prevent rotational movement of the meter jaw relative to the termination connector.

25. The method of claim 24, wherein the connector tab includes an inner wall that defines the opening, and wherein the punch creates deformations in the boss that rotationally lock the boss to the inner wall of the connector tab.

26. The method of claim 21, wherein the meter jaw is formed of a conductive material that is ductile so that the punch causes expansion of at least a portion of the boss within the opening of the connector tab.

27. The method of claim 26, wherein the conductive material comprises copper or a copper alloy.

28. The method of claim 21, wherein the boss is secured to the connector tab so as to prevent longitudinal movement of the meter jaw relative to the termination connector.

29. The method of claim 28, wherein the punch causes the boss and the connector tab to be swaged together.

30. The method of claim 28, wherein the connector tab includes an inner wall that defines the opening, and wherein the punch causes the boss to expand within the opening so that at least a portion of the boss engages the inner wall of the connector tab to create an interference fit therebetween.

* * * * *